United States Patent
Lee

(10) Patent No.: US 7,388,415 B2
(45) Date of Patent: Jun. 17, 2008

(54) DELAY LOCKED LOOP WITH A FUNCTION FOR IMPLEMENTING LOCKING OPERATION PERIODICALLY DURING POWER DOWN MODE AND LOCKING OPERATION METHOD OF THE SAME

(75) Inventor: Hyun Woo Lee, Kyeongki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 69 days.

(21) Appl. No.: 11/489,631

(22) Filed: Jul. 20, 2006

(65) Prior Publication Data

US 2007/0188206 A1    Aug. 16, 2007

(30) Foreign Application Priority Data

Feb. 16, 2006    (KR) ..................... 10-2006-0015011

(51) Int. Cl.
    *H03L 7/06*    (2006.01)
(52) U.S. Cl. ................ 327/158; 327/156; 327/159
(58) Field of Classification Search ............. 327/152, 327/153, 284, 149, 161, 158, 250, 252, 156, 327/159
    See application file for complete search history.

(56) References Cited

U.S. PATENT DOCUMENTS

| | | | | |
|---|---|---|---|---|
| 2003/0140318 A1* | 7/2003 | Kitahara et al. | ................ | 716/1 |
| 2005/0127963 A1* | 6/2005 | Johnson | ...................... | 327/158 |

FOREIGN PATENT DOCUMENTS

| | | |
|---|---|---|
| JP | 2000-021165 | 1/2000 |
| JP | 2003-272380 | 9/2003 |
| KR | 1020010064123 | 7/2001 |
| KR | 1020030002131 | 1/2003 |
| KR | 20040095965 | 11/2004 |
| KR | 1020040091974 | 11/2004 |
| KR | 1020050081615 | 8/2005 |

OTHER PUBLICATIONS

Korean Notice of Allowance for 2006-15011.

* cited by examiner

*Primary Examiner*—Charles D. Garber
*Assistant Examiner*—Daniel Rojas
(74) *Attorney, Agent, or Firm*—Lowe Hauptman Ham & Berner LLP

(57) ABSTRACT

A Delay Locked Loop (DLL) having a function of periodically executing a locking operation during a power down mode and a locking operation method of the same, which includes a global clock generator, a clock delay unit, and a power down control unit. The power down control unit, in response to some of a plurality of global clock signals, a phase detection signal, and a power down signal, outputs an input clock signal to each of the global clock generator and the clock delay unit. During the power down mode, the clock delay unit is enabled to periodically carry out the locking operation whenever it receives the input clock signal. Therefore, a consumed power of the DLL can be decreased during the power down mode, and a phase difference between an external clock signal and an internal clock signal during the power down mode can be decreased by the periodical locking operation of the clock delay unit, so that the DLL can operate at a fast speed after the power down mode.

60 Claims, 14 Drawing Sheets

DELAY LOCKED LOOP WITH A FUNCTION FOR IMPLEMENTING LOCKING OPERATION PERIODICALLY DURING POWER DOWN MODE AND LOCKING OPERATION METHOD OF THE SAME

BACKGROUND

1. Field of the Invention

The present invention relates to a semiconductor device and more particularly, to a Delay Locked Loop (DLL) generating an internal clock signal.

2. Discussion of Related Art

In general, mobile products such as camcorders, digital cameras, cell phones, MP3 (MPEG-1 Layer3) players, or the like should operate for a long time with a low power, so that consumed powers of the semiconductor devices included in the mobile products should be decreased. Meanwhile, the DLL includes a plurality of delay units which consume a relatively large amount of currents, so that its consumed power increases at the time of locking operation of the DLL. Accordingly, in the case of the semiconductor device including the DLL, the consumed power of the DLL takes up a relatively large amount of the total consumed power of the semiconductor device. Consequently, when the consumed power of the DLL decreases, the total consumed power of the semiconductor device can be significantly decreased. Accordingly, when the semiconductor device enters into a power down mode (or a standby mode) in order to decrease the consumed power of the semiconductor device including the DLL, the DLL can be designed to be disabled. However, when a time (e.g., 7 µs or 8 µs) taken for maintaining the semiconductor device in the power down mode increases, a time taken for the DLL to carry out the locking operation again increases in an active mode after the power down mode. This is because that the DLL, when it enters into the power down mode, is disabled while maintaining the previous locking state. Accordingly, when a phase of an external clock signal before the power down mode becomes different from a phase of the external clock signal after the power down mode, a phase difference between the external clock signal and an internal clock signal occurring while the DLL is locked in the previous locking state significantly increases out of the predetermined range after the power down mode. In this case, the DLL carries out the locking operation so as to make the internal clock signal synchronized with the changed external clock signal, and the locking operation time of the DLL increases when the phase difference between the internal clock signal and the external clock signal increases. That is, the time taken for having the DLL locked increases. As such, when the locking operation time of the DLL increases, an operational speed of the semiconductor device decreases, and an operational performance of the semiconductor device is degraded. Such a phenomenon may be more severe when the time taken for maintaining the semiconductor device in the power down mode increases (i.e., when the time taken for disabling the DLL increases). The DLL may be designed to keep an enabled state even when the semiconductor device enters into the power down mode (or standby mode) in order to increase the operational speed of the semiconductor device including the DLL. However, when the DLL is continuously enabled, the consumed power of the DLL increases, so that the total consumed power of the semiconductor device increases.

SUMMARY OF THE INVENTION

The present invention is directed to a DLL capable of decreasing a consumed power during a power down mode and operating at a fast speed in a normal operation after the power down mode by being periodically enabled during the power down mode to carry out a locking operation, thereby decreasing a phase difference between an external clock signal and an internal clock signal.

The present invention is also directed to a locking operation method of a DLL capable of decreasing a consumed power during a power down mode and operating at a fast speed in a normal operation after the power down mode by periodically being enabled during the power down mode to carry out a locking operation, thereby decreasing a phase difference between an external clock signal and an internal clock signal.

An aspect of the present invention is to provide a DLL, which includes a global clock generator, a clock delay unit, and a power down control unit. The global clock generator generates a plurality of global clock signals based on an input clock signal. The clock delay unit operates in synchronization with one of the global clock signals, compares a phase of a reference clock signal generated based on the input clock signal with a phase of the input clock signal, and outputs a phase detection signal in accordance with the comparison and delays the input clock signal by a predetermined time to output a delay clock signal. The power down control unit outputs the input clock signal to both of the global clock generator and the clock delay unit in response to some of the global clock signals, the phase detection signal, and a power down signal.

Another aspect of the present invention is to provide a DLL, which includes a clock generator, a phase detector, a coarse delay unit, a fine delay unit, a delay control unit, a replica delay unit, and a power down control unit. The global clock generator generates a plurality of global clock signals based on an input clock signal. The phase detector detects a phase difference between the input clock signal and a reference clock signal, and outputs a phase detection signal and a detection signal in accordance with the detection. The coarse delay unit adjusts a coarse delay time in response to a coarse delay control signal, delays the input clock signal for the adjusted coarse delay time, and outputs first and second coarse delay clock signals. The fine delay unit mixes the first and second coarse delay clock signals in response to a fine delay control signal, and selects one of a plurality of mixed signals having different phases from each other and present between the first and second coarse delay clock signals to output the selected signal as a delay clock signal. The delay control unit generates the coarse delay control signal and the fine delay control signal in response to the detection signal, and outputs the coarse delay control signal and the fine delay control signal to the coarse delay unit and the fine delay unit in synchronization with one of the global clock signals, respectively. The replica delay unit delays the delay clock signal by a predetermined time, and outputs the delayed signal as the reference clock signal. The power down control unit outputs the input clock signal to all of the global clock generator, the phase detector, and the coarse delay unit in response to some of the global clock signals, the phase detection signal, and a power down signal.

Another aspect the present invention is to provide a DLL, which includes a global clock generator, a clock delay unit, and a power down control unit. The global clock generator generates first to N (N is an integer) global clock signals based on an input clock signal. The clock delay unit operates in synchronization with some of the first to N global clock signals, compares a phase of the input clock signal with a phase of each of first and second reference clock signals generated based on the input clock signal, outputs a phase detection signal in accordance with the comparison, delays the input clock signal by a predetermined time, and corrects a duty ratio of the delayed input clock signal to output a corrected clock signal. The power down control unit outputs the input clock signal to both of the global clock generator and the clock delay unit in response to some of the global clock signals, the phase detection signal, and a power down signal.

Another aspect the present invention is to provide a locking operation method of a DLL, which includes outputting a locking enable signal with a first logic level in an active mode, with the first logic level for a predetermined time once per predetermined number of cycles of an input clock signal in a power down mode and a second logic level during the rest period except the period of the first logic level in the total period of the power down mode; outputting the input clock signal to a clock delay unit so as to have the clock delay unit detect a phase difference between the input clock signal and a reference clock signal when the locking enable signal has the first logic level, generate a phase detection signal in accordance with the detection, and selectively carry out a locking operation; and stopping an operation of outputting the input clock signal to the clock delay unit so as to have the clock delay unit stop the locking operation when the locking enable signal has the second logic level.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the invention to those skilled in the art. Like numerals refer to like elements throughout the specification.

Hereinafter, it will be described about an exemplary embodiment of the present invention in conjunction with the accompanying drawings.

Figure 1:
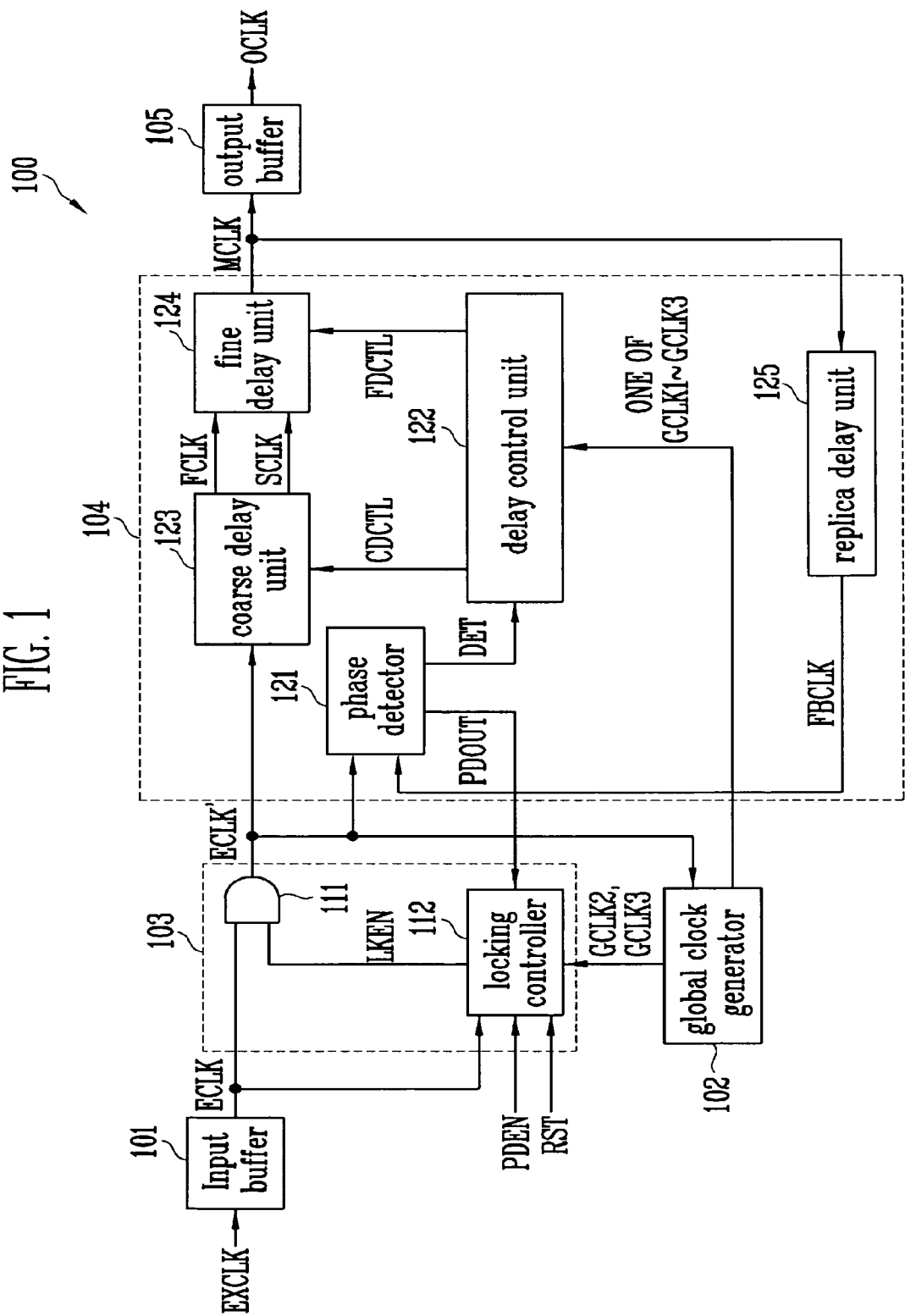
FIG. 1 is a block diagram schematically illustrating a DLL in accordance with an embodiment of the present invention.
Figure 2:
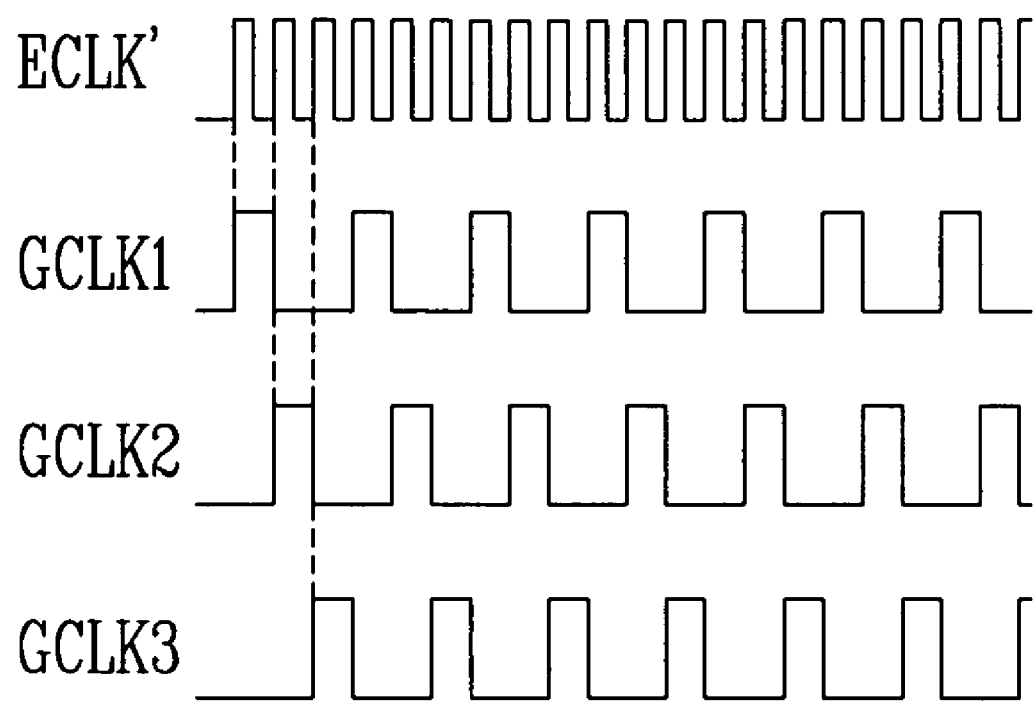
FIG. 2 is a timing diagram of signals associated with an operation of the global clock generator illustrated in FIG. 1.

FIG. 1 is a block diagram schematically illustrating the DLL in accordance with an embodiment of the present invention. Referring to FIG. 1, the DLL 100 includes an input buffer 101, a global clock generator 102, a power down control unit 103, a clock delay unit 104, and an output buffer 105. The input buffer 101 receives an external clock signal EXCLK and outputs it as an input clock signal ECLK. The global clock generator 102 generates global clock signals GCLK1 to GCLK3 based on an input clock signal ECLK'. To detail this, as can be seen in FIG. 2, the global clock generator 102 generates the global clock signals GCLK1 to GCLK3 in the form of pulse signal which have different phases from each other and are periodically toggled. Preferably, a pulse width of each of the global clock signals GCLK1 to GCLK3 may be set to correspond to one period of the input clock signal ECLK', and may be changed if necessary. The number of global clock signals generated by the global clock generator 102 may increase or decrease in proportion to the number of devices which are disposed inside or outside the DLL 100 and should operate in synchronization with the global clock signal. In this case, the global clock signal determines the operational order of the devices which should operate in synchronization with the global clock signal. That is, the devices sequentially operate in synchronization with the respective global clock signals.

The power down control unit 103 includes an output logic circuit 111 and a locking controller 112. The output logic circuit 111 receives the input clock signal ECLK, outputs the input clock signal ECLK' to both of the global clock generator 102 and the clock delay unit 104 in response to a locking enable signal LKEN, or stops an output operation of the input clock signal ECLK'. In this case, the ECLK and ECLK' which are input clock signals have substantially the same phase as each other. Preferably, the output logic circuit 111 may be implemented as an AND gate. In this case, when the locking enable signal LKEN is enabled, the output logic circuit 111 outputs the input clock signal ECLK to both of the global clock generator 102 and the clock delay unit 104 as the input clock signal ECLK'. In addition, when the locking enable signal LKEN is disabled, the output logic circuit 111 stops an output operation of the input clock signal ECLK'. To detail this, while the locking enable signal LKEN is disabled, the output logic circuit 111 keeps the input clock signal ECLK' in a logical low state. Hereinafter, the output logic circuit locking enable signal LKEN in response to the global clock signals GCLK2 and GCLK3, a power down signal PDEN, an external reset signal RST, and a phase detection signal PDOUT. Preferably, the power down signal PDEN is enabled when a semiconductor device (not shown) including the DLL 100 is in a power down mode and is disabled when the device is in an active mode.

The clock delay unit 104 includes a phase detector 121, a delay control unit 122, a coarse delay unit 123, a fine delay unit 124, and a replica delay unit 125. When the input clock signal ECLK' is received, the phase detector 121 detects a phase difference between the input clock signal ECLK' and the reference clock signal FBCLK, and outputs the phase detection signal PDOUT and a detection signal DET in accordance with the detection. Preferably, the phase detector 121 disables the phase detection signal PDOUT when the phase difference is within a predetermined range, and enables the phase detection signal PDOUT when the phase difference is out of the range. In addition, when the input clock signal ECLK' is not received, the phase detector 121 enables the phase detection signal PDOUT.

The delay control unit 122 generates a coarse delay control signal CDCTL and a fine delay control signal FDCTL in response to the detection signal DET. In addition, the delay control unit 122 outputs the coarse delay control signal CDCTL and the fine delay control signal FDCTL to the coarse delay unit 123 and the fine delay unit 124 in synchronization with one of the global clock signals GCLK1 to GCLk3, respectively. The coarse delay unit 123 adjusts a coarse delay time in response to the coarse delay control signal CDCTL, delays the input clock signal ECLK' by the adjusted coarse delay time, and outputs coarse delay clock signals FCLK and SCLK. Preferably, a phase of any one of the coarse delay clock signals FCLK and SCLK precedes a phase of the other by a unit delay time. A configuration and a detailed operation description of the coarse delay unit 123 can be well understood by those skilled in the art, so that they will be omitted for simplicity of description. The fine delay unit 124 mixes the coarse delay clock signals FCLK and SCLK in response to the fine delay control signal FDCTL, selects one of a plurality of mixed signals (not shown) having different phases from each other and present between the coarse delay clock signals FCLK and SCLK, and outputs the selected signal as a delay clock signal MCLK. A configuration and a detailed operation description of the fine delay unit 124 can be well understood by those skilled in the art, so that they will be omitted for simplicity of description. In this case, although not shown in FIG. 1, the fine delay control signal FDCTL may include a plurality of bits. The delay control unit 122, until the coarse delay unit 123 is locked, changes and outputs a logic value of the coarse delay control signal CDCTL and keeps a bit value of the fine delay control signal FDCTL to an initial set value. After the coarse delay unit 123 is locked, the delay control unit 122 keeps the logic value of the coarse delay control signal CDCTL, and changes the bit value of the fine delay control signal FDCTL in response to the detection signal DET. As a result, the signal selected by the fine delay unit 124 among the plurality of mixed signals is changed whenever the bit value of the fine delay control signal FDCTL is changed. The replica delay unit 125 delays the delay clock signal MCLK by a predetermined time, and outputs the delayed signal as the reference clock signal FBCLK. The output buffer 105 outputs an internal clock signal OCLK in response to the delay clock signal MCLK.

Figure 3:
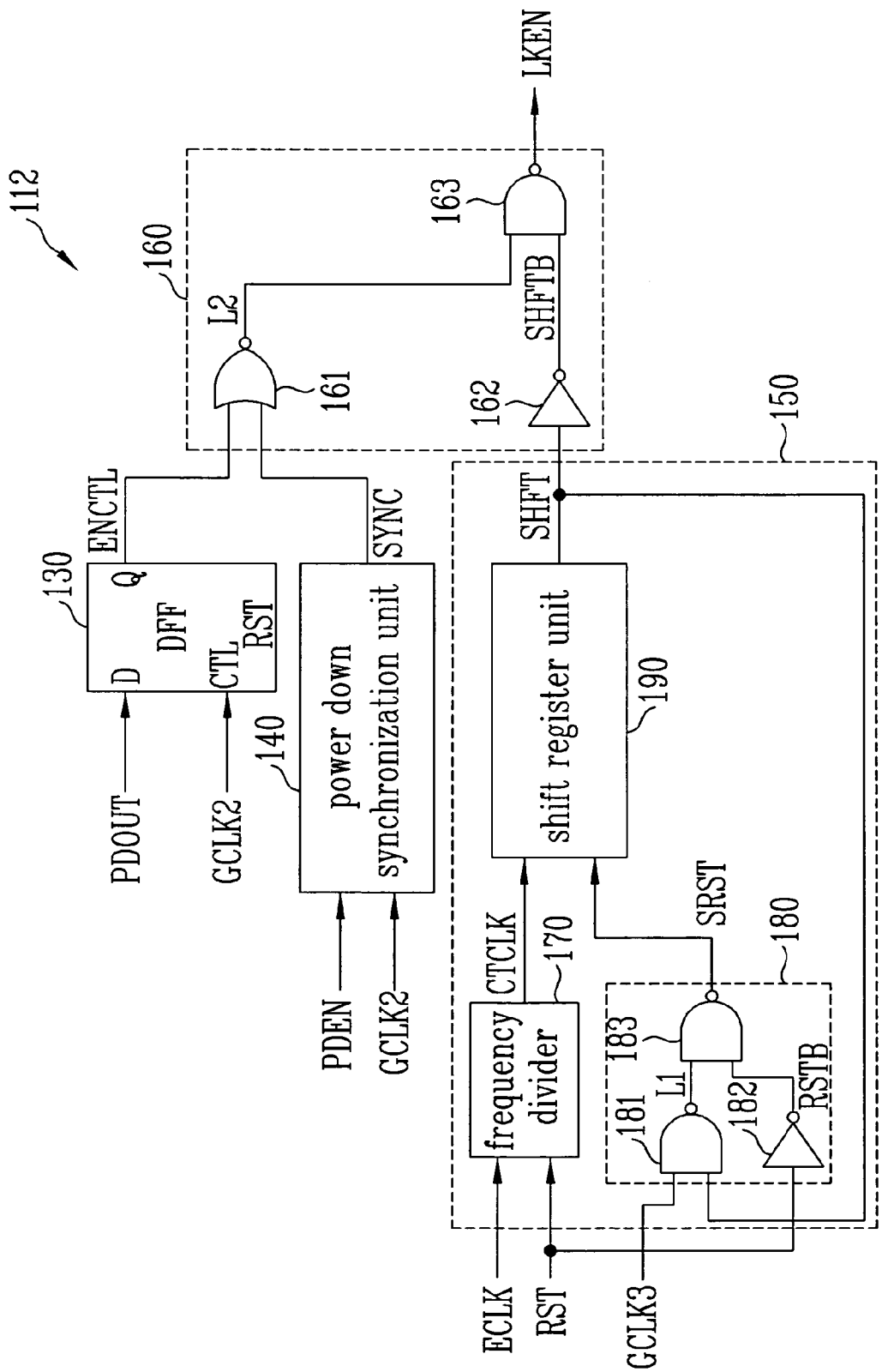
FIG. 3 is a diagram illustrating the locking controller of FIG. 1 in detail.

FIG. 3 is a diagram illustrating the locking controller of FIG. 1 in detail. Referring to FIG. 3, the locking controller 112 includes an enable control unit 130, a power down synchronization unit 140, a locking period determination unit 150, and a control logic circuit 160. The enable control unit 130 generates an enable control signal ENCTL in response to the phase detection signal PDOUT and the global clock signal GCLK2. Preferably, the enable control unit 130 may be implemented as a D flip-flop. In this case, the phase detection signal PDOUT is input to a D input terminal of the D flip-flop 130, and the global clock signal GCLK2 is input to its clock input terminal. When the global clock signal GCLK2 is toggled, the D flip-flop 130 receives the phase detection signal PDOUT in synchronization with the global clock signal GCLK2, and outputs the enable control signal ENCTL based on the phase detection signal PDOUT. For example, when the global clock signal GCLK2 is toggled (particularly at a rising or falling edge of the global clock signal GCLK2), the D flip-flop 130 disables the enable control signal ENCTL when the phase detection signal PDOUT is disabled. In addition, when the global clock signal GCLK2 is toggled (particularly at a rising edge of the global clock signal GCLK2), the D flip-flop 130 enables the enable control signal ENCTL when the phase detection signal PDOUT is enabled.

Figure 4:
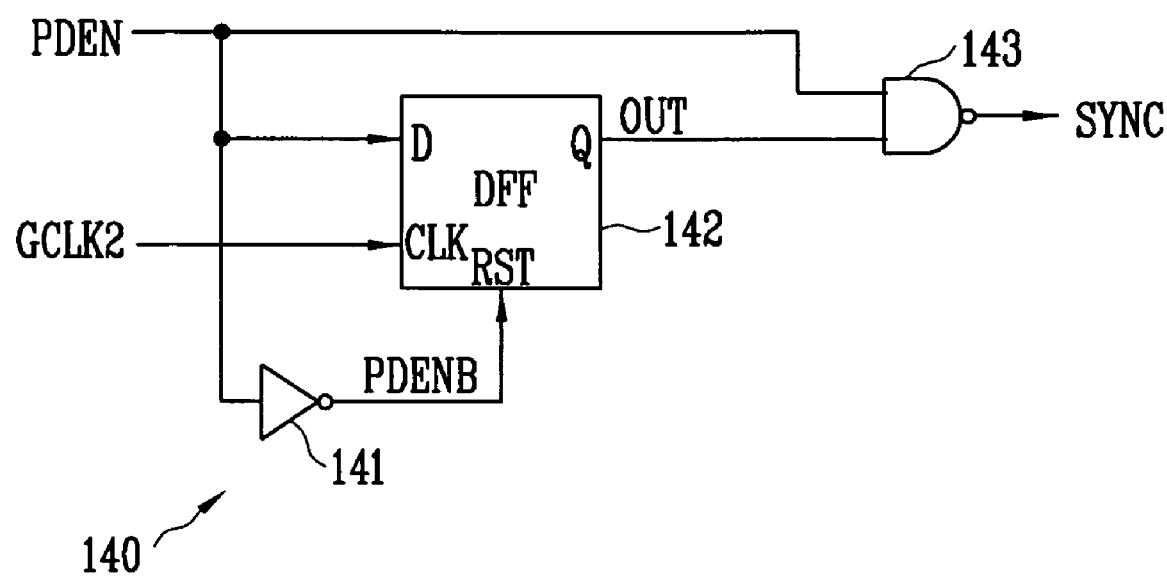
FIG. 4 is a diagram illustrating the power down synchronization unit of FIG. 3 in detail.

The power down synchronization unit 140 generates a synchronization signal SYNC in response to the power down signal PDEN and the global clock signal GCLK2. To detail this, when the power down signal PDEN is enabled (i.e., in a power down mode), the power down synchronization unit outputs the synchronization signal SYNC in a logical low state when the global clock signal GCLK2 is toggled. In addition, when the power down signal PDEN is disabled (i.e., in an active mode), the power down synchronization unit outputs the synchronization signal SYNC in a logical high state when the global clock signal GCLK2 is toggled. The power down synchronization unit 140 generates the synchronization signal SYNC to have the DLL 100 disabled or enabled in synchronization with the global clock signal GCLK2 when the DLL enters into or exits the power down mode. Hereinafter, a configuration and a detailed operation of the power down synchronization unit 140 will be described with reference to FIG. 4. The power down synchronization unit 140 includes an inverter 141, a D flip-flop 142, and a NAND gate 143. The inverter 141 inverts the power down signal PDEN, and outputs the inverted power down signal PDENB. The power down signal PDEN is input to a D input terminal of the D flip-flop 142, the global clock signal GCLK2 to its clock input terminal, and the inverted power down signal PDENB to its reset terminal. The D flip-flop 142 is reset when the inverted power down signal PDENB is enabled. The D flip-flop 142 receives the power down signal PDEN and outputs it as an internal synchronization signal OUT when the global clock signal GCLK2 is toggled. To detail this, when the global clock signal GCLK2 is toggled, the D flip-flop 142 enables the internal synchronization signal OUT when the power down signal PDEN is enabled. In addition, when the global clock signal GCLK2 is toggled, the D flip-flop 142 disables the internal synchronization signal OUT when the power down signal PDEN is disabled. The NAND gate 143 outputs the synchronization signal SYNC in response to the power down signal PDEN and the internal synchronization signal OUT. Preferably, when both of the power down signal PDEN and the internal synchronization signal OUT are enabled, the NAND gate 143 outputs the synchronization signal SYNC in a logical low state. In addition, when any one of the power down signal PDEN and the internal synchronization signal OUT is disabled, the NAND gate 143 outputs the synchronization signal SYNC in a logical high state.

Figure 5:
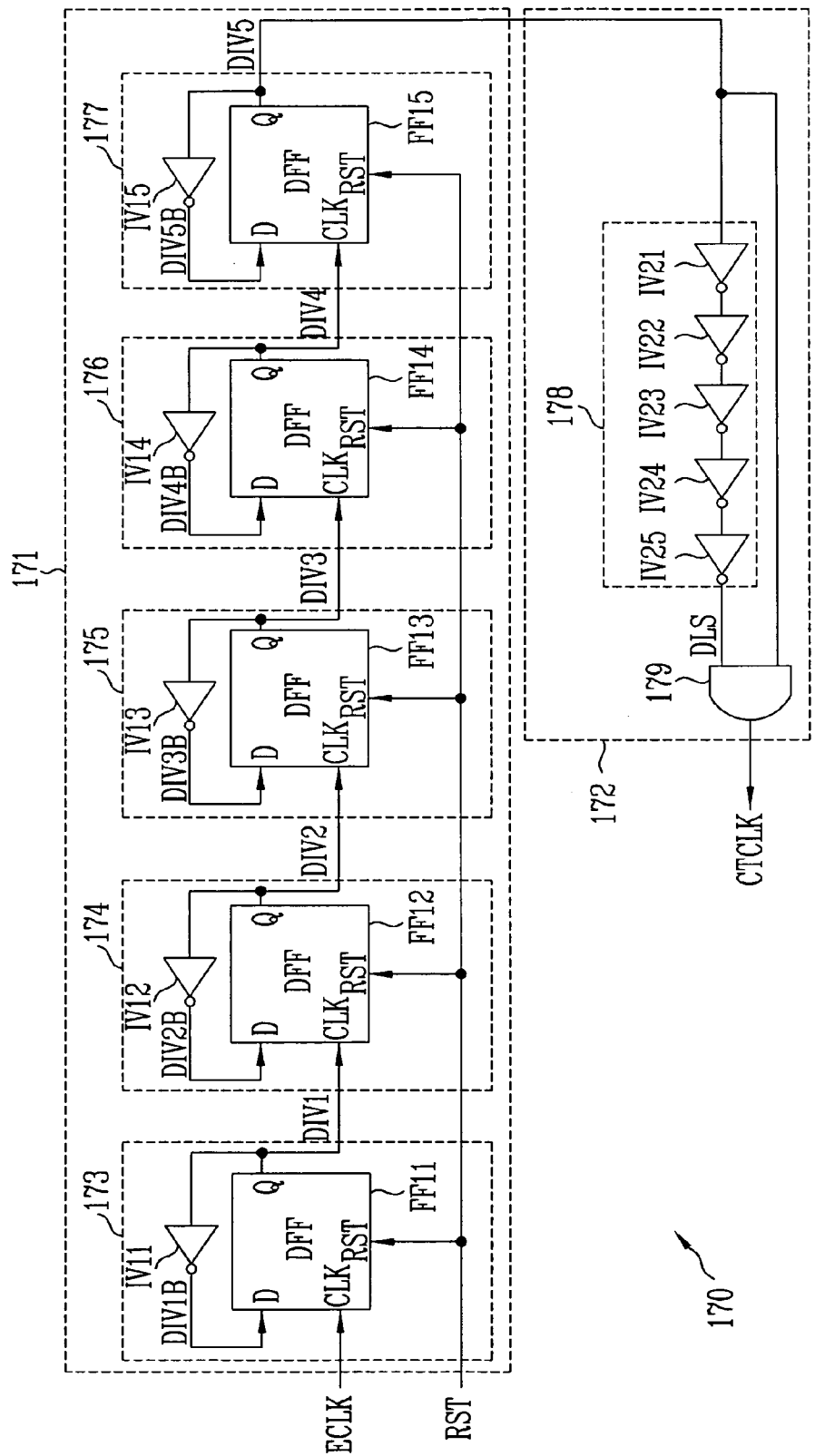
FIG. 5 is a diagram illustrating the divider of FIG. 3 in detail.
Figure 6:
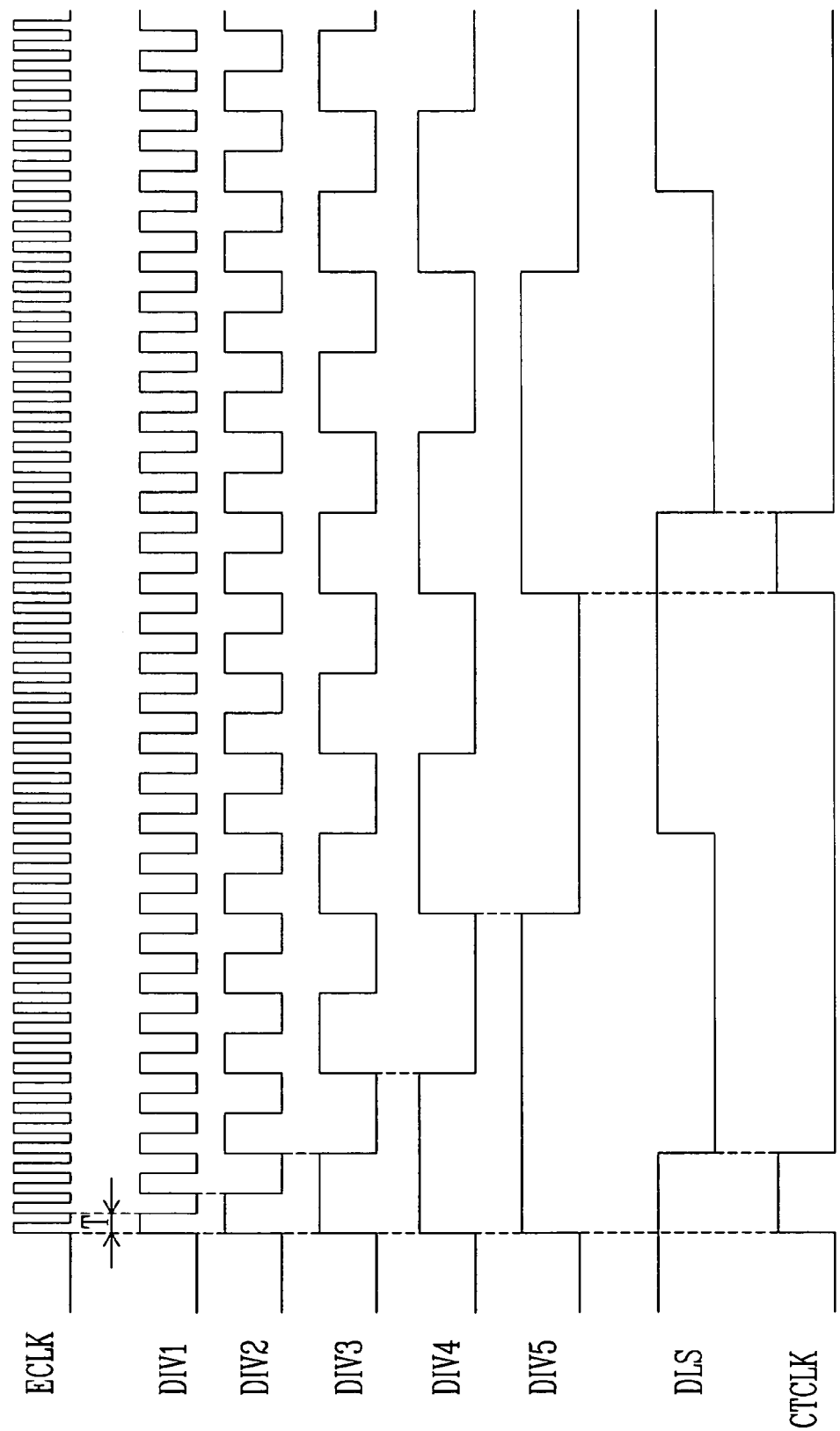
FIG. 6 is a timing diagram of signals associated with an operation of the divider illustrated in FIG. 5.

Referring back to FIG. 3, the locking period determination unit 150 includes a divider 170, a reset control logic circuit 180, and a shift register unit 190. The divider 170 divides the input clock signal ECLK by a predetermined division rate to generate a control clock signal CTCLK. In addition, the divider 170 is reset in response to the external reset signal RST. Hereinafter, a configuration and a detailed operation of the divider 170 will be described with reference to FIG. 5. FIG. 5 is a diagram illustrating the divider of FIG. 3 in detail. The divider 170 includes a division signal generator 171 and a control clock output circuit 172. The division signal generator 171 is reset in response to the external reset signal RST. The division signal generator 171 divides the input clock signal ECLK by a predetermined division rate, and outputs a division output signal DIV5. The division signal generator 171 includes a series of division circuits 173 to 177. The division circuit 173 has an inverter IV11 and a D flip-flop FF11. The inverter IV11 inverts a division signal DIV1 to output an inverted division signal DIV1B. The inverted division signal DIV1B is input to a D input terminal of the D flip-flop FF11, the input clock signal ECLK to its clock input terminal, and the external reset signal RST to its reset terminal. The D flip-flop FF11 receives the inverted division signal DIV1B and outputs it as the division signal DIVI when the input clock signal ECLK is toggled. A configuration and a detailed operation of the division circuits 174 to 177 are similar to each other, so that the description will be focused on the division circuit 174. The division circuit 174 includes an inverter IV12 and a D flip-flop FF12. The inverter IV12 inverts a division signal DIV2 to output an inverted division signal DIV2B. The inverted division signal DIV2B is input to a D input terminal of the D flip-flop FF12, the division signal DIVI to its clock input terminal, and the external reset signal RST to its reset terminal. The D flip-flop FF12 receives the inverted division signal DIV2B and outputs it as the division signal DIV2 when the division signal DIV1 is toggled. Referring to FIG. 6, it can be seen that each period of the division signals DIV1 to DIV4 output by the respective division circuits 173 to 176 and a period of the division output signal DIV5 output by the division circuit 177 are larger than a period of the input clock signal ECLK. For example, when the period of the input clock signal ECLK is 'T', the periods of the division signals DIV1 to DIV4 and the period of the division output signal DIV5 are 2T, 4T, 8T, and 16T, respectively. Consequently, it can be seen that the division signal generator 171 acts as a counter. Preferably, when the number of division circuits included in the division signal generator 171 is changed, the predetermined division rate of the divider 170 is changed.

The control clock output circuit 172 outputs the control clock signal CTCLK based on the division output signal DIV5. The control clock output circuit 172 includes a delay logic circuit 178 and a clock output circuit 179. The delay logic circuit 178 includes inverters IV21 to IV25 which are connected in series to an output terminal Q of the D flip-flop FF15. The delay logic circuit 178 delays the division output signal DIV5 to output a delay signal DLS. To detail this, the delay logic circuit 178 inverts and delays the division output signal DIV5. The clock output circuit 179 outputs the control clock signal CTCLK in response to the division output signal DIV5 and the delay signal DLS. Preferably, the clock output circuit 179 may be implemented as an AND gate. In this case, the clock output circuit 179 outputs the control clock signal CTCLK in a logical high state when both of the division output signal DIV5 and the delay signal DLS are in a logical high state as can be seen in FIG. 6.

Referring back to FIG. 3, the reset control logic circuit 180 includes NAND gates 181 and 183, and an inverter 182. The NAND gate 181 outputs a logic signal L1 in response to the global clock signal GCLK3 and the shift output signal SHFT. The inverter 182 inverts the external reset signal RST, and outputs an inverted external reset signal RSTB. The NAND gate 183 outputs a reset control signal SRST in response to the logic signal L1 and the inverted external reset signal RSTB. Preferably, the reset control logic circuit 180 enables the reset control signal SRST when the external reset signal RST is enabled or the global clock signal GCLK3 and the shift output signal SHFT are enabled.

Figure 7:
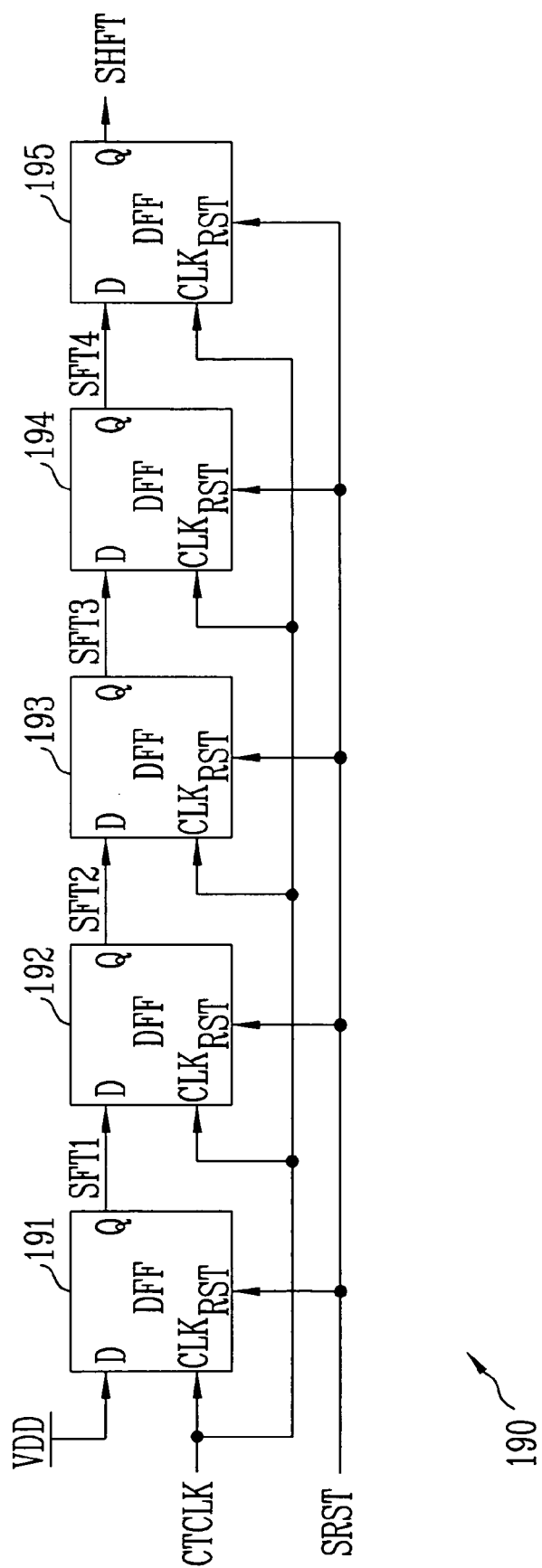
FIG. 7 is a diagram illustrating the shift register unit of FIG. 3 in detail.

The shift register unit 190 is reset in response to the reset control signal SRST. To detail this, the shift register unit 190 is reset when the reset control signal SRST is enabled. After the shift register unit 190 is reset, it generates the shift output signal SHFT in response to the control clock signal CTCLK. In particular, when the predetermined number of cycles of the control clock signal CTCLK passes after the shift register unit 190 is reset, the shift register unit enables the shift output signal SHFT and is reset when the reset control signal SRST is enabled. Hereinafter, a configuration and a detailed operation of the shift register unit 190 will be described with reference to FIG. 7. The shift register unit 190 includes shift registers 191 to 195. Preferably, each of the shift registers 191 to 195 may be implemented as a D flip-flop. Hereinafter, each of the shift registers 191 to 195 will be referred to as a D flip-flop. The control clock signal CTCLK is input to a clock input terminal of each of the D flip-flops 191 to 195, and the reset control signal SRST is input to each reset terminal of the D flip-flops. The D flip-flops 191 to 195 are reset when the reset control signal SRST is enabled. An internal voltage VDD is supplied to a D input terminal of the D flip-flop 191. When the control clock signal CTCLK is toggled (i.e., at a rising or falling edge of the control clock signal CTCLK), the D flip-flop 191 receives the internal voltage VDD, and enables a shift signal SFT1. Operations of the D flip-flops 192 to 195 are similar to each other, so that the description will be focused on the D flip-flop 192. When the control clock signal CTCLK is toggled, the D flip-flop 192 outputs a shift signal SFT2 in response to the shift signal SFT1. For example, when the control clock signal CTCLK is toggled, the D flip-flop 192 enables the shift signal SFT2 when the shift signal SFT1 is enabled. Consequently, the D flip-flop 195 enables the shift output signal SHFT after the predetermined number of cycles (e.g., 5 cycles in FIG. 7) of the control clock signal CTCLK. Accordingly, a time until that the shift output signal SHFT is enabled after the shift register unit 190 is reset can be adjusted in accordance with the number of D flip-flops (i.e., shift registers) included in the shift register unit 190.

Referring back to FIG. 3, the control logic circuit 160 includes a NOR gate 161, an inverter 162, and a NAND gate 163. The NOR gate 161 outputs a logic signal L2 in response to the enable control signal ENCTL and the synchronization signal SYNC. To detail this, when any one of the enable control signal ENCTL and the synchronization signal SYNC is in a logical high state, the NOR gate 161 outputs the logic signal L2 in a logical low state. In addition, when both of the enable control signal ENCTL and the synchronization signal SYNC are in a logical low state, the NOR gate 161 outputs the logic signal L2 in a logical high state. The inverter 162 inverts the shift output signal SHFT, and outputs an inverted shift output signal SHFTB. The NAND gate 163 outputs the locking enable signal LKEN in response to the inverted shift output signal SHFTB and the logic signal L2. Preferably, the control logic circuit 160 enables the locking enable signal LKEN when any one of the enable control signal ENCTL and the synchronization signal SYNC is in a logical high state or the shift output signal SHFT is in a logical high state.

Figure 8:
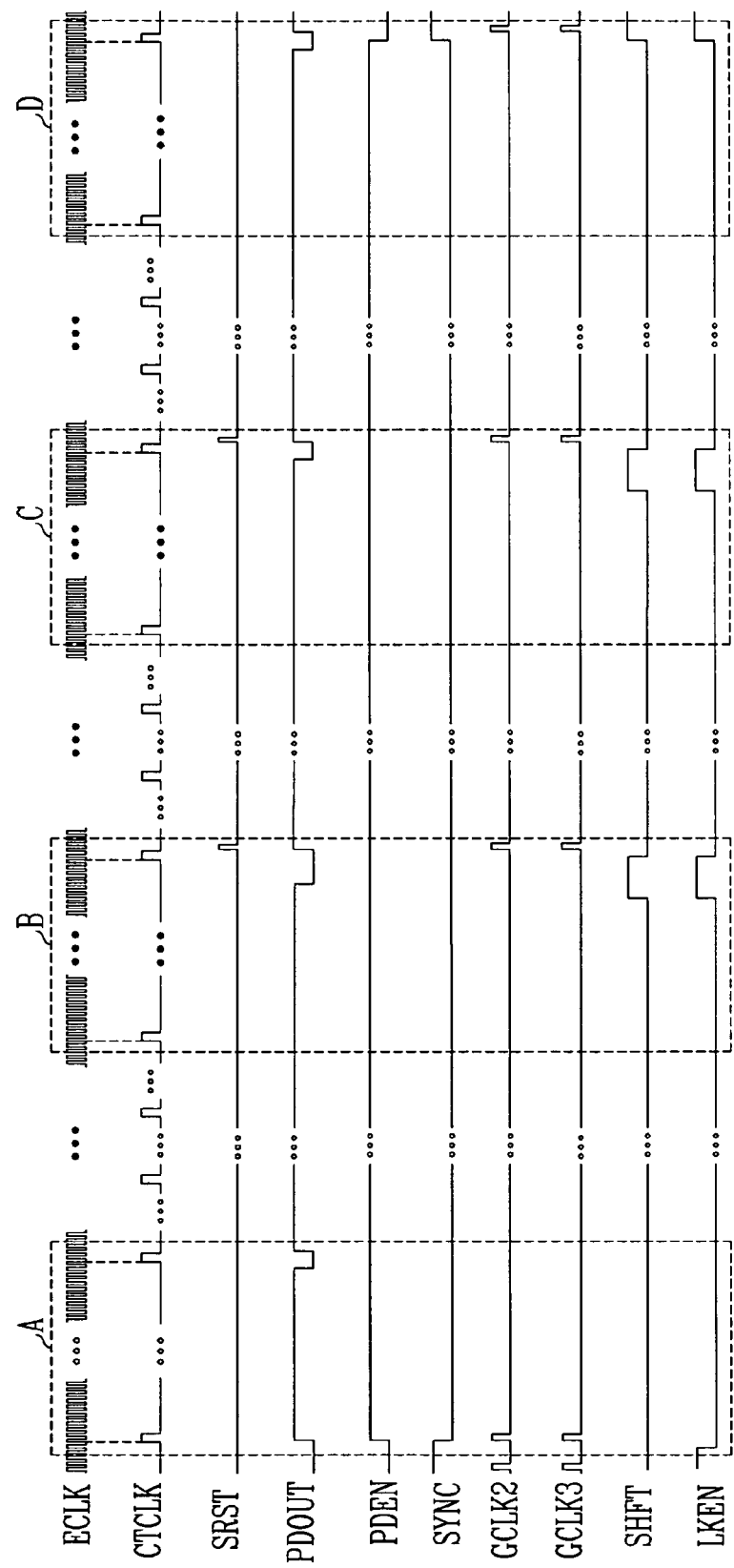
FIG. 8 is a timing diagram of signals associated with an operation of the locking controller illustrated in FIG. 3.
Figure 9:
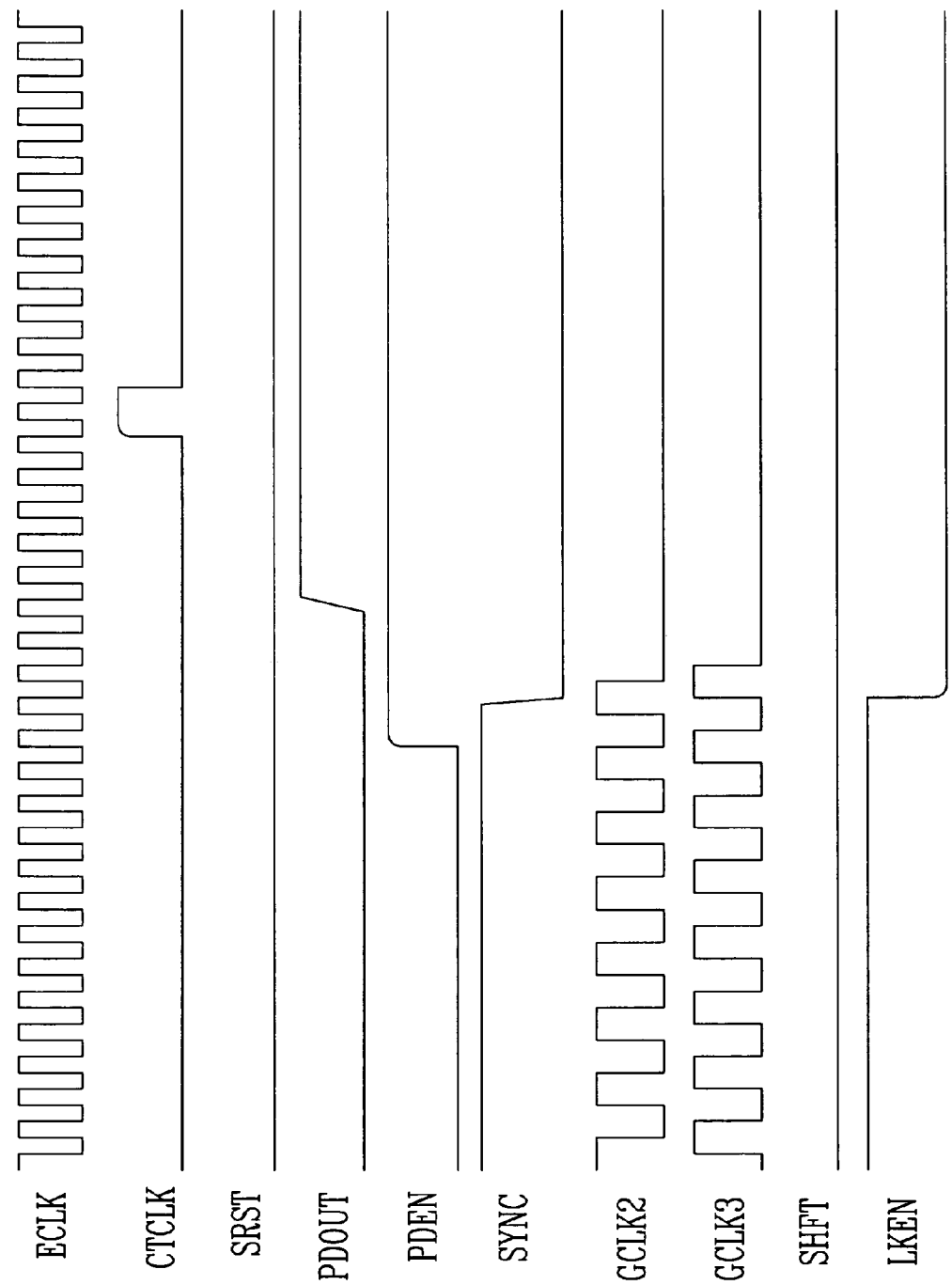
FIGS. 9 to 12 are enlarged diagrams of 'A' to 'D' illustrated in FIG. 8, respectively.
Figure 10:
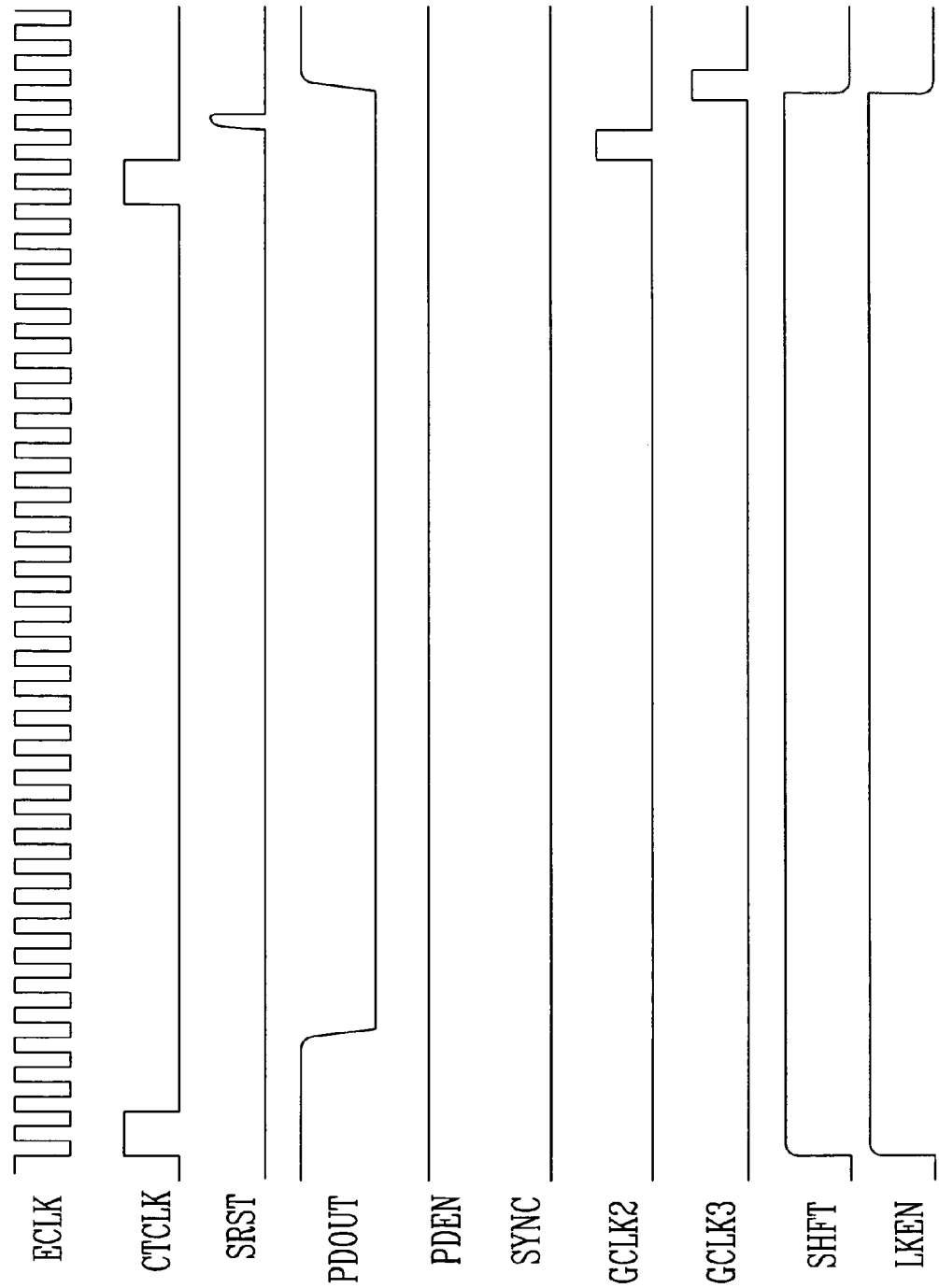
Figure 11:
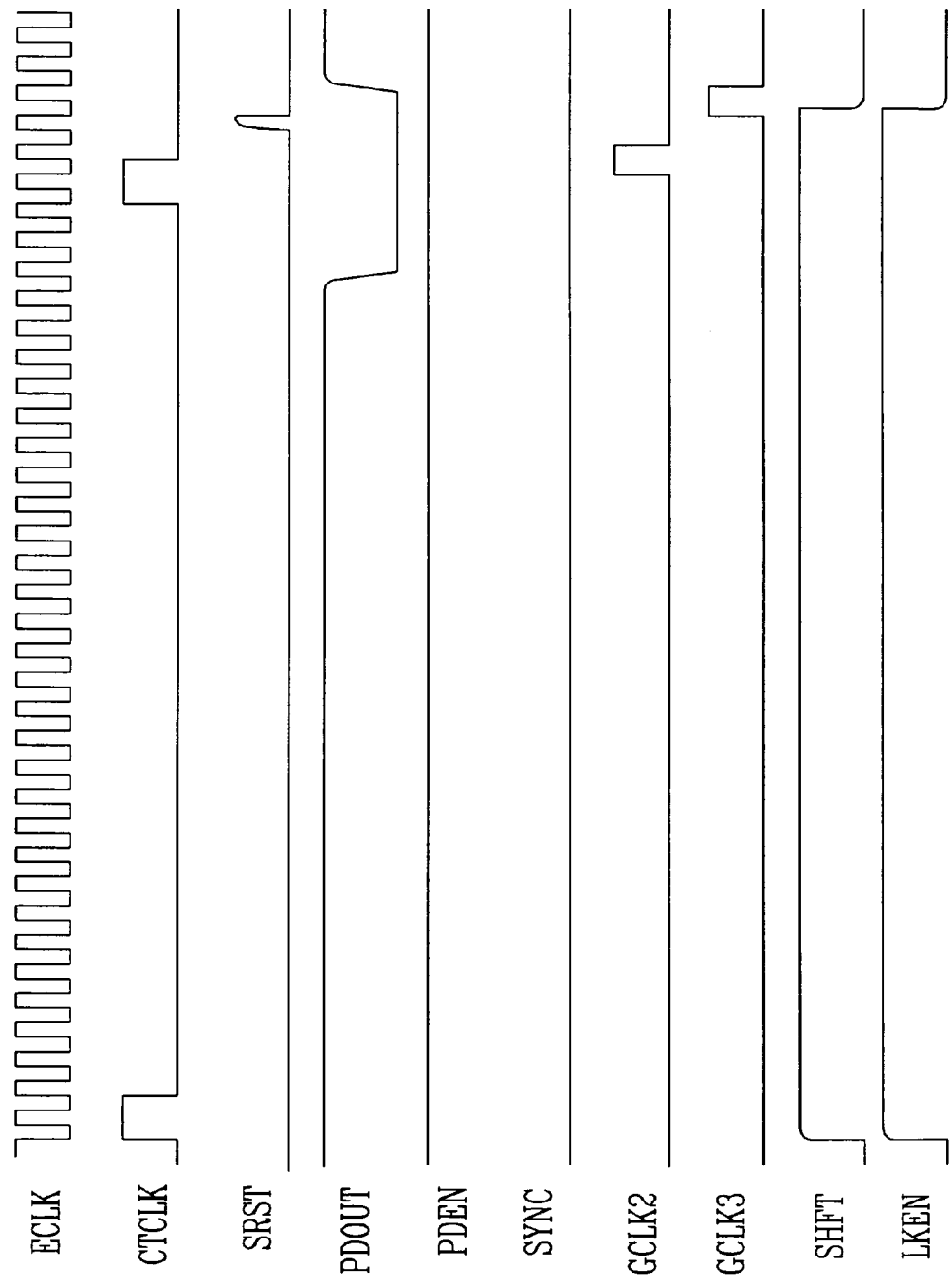

Next, an operation of the DLL 100 in the power down mode will be described in detail with reference to FIGS. 8 to 12. FIG. 8 is a timing diagram of signals associated with an operation of the locking controller illustrated in FIG. 3, and FIGS. 9 to 12 are enlarged diagrams of 'A' to 'D' illustrated in FIG. 8.

The input buffer 101 first receives an external clock signal EXCLK and outputs it to the AND gate 111 and the locking controller 112 of the power down control unit 103 as an input clock signal ECLK. Referring to the 'A' portion of FIG. 8 and FIG. 9, before the DLL 100 enters into the power down mode, that is, when the power down signal PDEN is in a disabled state, the power down synchronization unit 140 of the locking controller 112 outputs the synchronization signal SYNC in a logical high state. As a result, the control logic circuit 160 of the locking controller 112 enables the locking enable signal LKEN in response to the synchronization signal SYNC. The AND gate 111 receives the input clock signal ECLK and the locking enable signal LKEN, and outputs the input clock signal ECLK' to the global clock generator 102, the phase detector 121 and the coarse delay unit 123 of the clock delay unit 104. The clock delay unit 104 carries out a locking operation based on the input clock signal ECLK' when it receives the input clock signal ECLK', and outputs a delay clock signal MCLK. The output buffer 105 outputs an internal clock signal OCLK in response to the delay clock signal MCLK.

Meanwhile, the global clock generator 102 generates global clock signals GCLK1 to GCLK3 based on the input clock signal ECLK' when it receives the input clock signal ECLK'. The locking period determination unit 150 of the locking controller 112 continuously operates in the power down mode and the active mode. This is because the input clock signal ECLK output from the input buffer 101 is always input to the divider 170 of the locking period determination unit 150 in the power down mode and the active mode. That is, the divider 170 divides the input clock signal ECLK by a predetermined division rate, and generates a control clock signal CTCLK in the form of pulse signal which is toggled one time per predetermined number of cycles (e.g., 32 cycles) of the input clock signal ECLK. The shift register unit 190 of the locking period determination 150 enables the shift output signal SHFT one time per predetermined number of cycles of the control clock signal CTCLK. The reset control logic circuit 180 enables the reset control signal SRST whenever the shift output signal SHFT is enabled. As a result, the shift register unit 190 repeatedly carries out an operation of being reset and enabling the shift output signal SHFT after the predetermined time. The control logic circuit 160 enables the locking enable signal LKEN regardless of the state of the shift output signal SHFT when the synchronization signal SYNC is in a logical high state. Accordingly, the DLL 100 carries out the locking operation while the synchronization signal SYNC is in a logical high state.

When the power down signal PDEN is then enabled, the power down synchronization unit 140 outputs the synchronization signal SYNC in a logical low state. The power down synchronization unit 140 keeps the synchronization signal SYNC in a logical low state while the power down signal PDEN is enabled. As a result, the control logic circuit 160 disables the locking enable signal LKEN in response to the synchronization signal SYNC. The AND gate 111 stops an output operation of the input clock signal ECLK' in response to the locking enable signal LKEN. The clock delay unit 104 stops the locking operation because the input clock signal ECLK' is not supplied thereto. The global clock generator 102 also stops the operation of generating the global clock signals GCLK1 to GCLK3 because the input clock signal ECLK' is not supplied thereto. Consequently, the DLL 100 enters into the power down mode.

While the synchronization signal SYNC is in a logical low state, the input clock signal ECLK is continuously input to the divider 170 without passing through the AND gate 111, so that the locking period determination unit 150 continuously operates. That is, the locking period determination unit 150 periodically enables the shift output signal SHFT. In response to the shift output signal SHFT which is periodically enabled, the control logic circuit 160 periodically enables the locking enable signal LKEN as indicated in 'B' of FIG. 8 and 'C' of FIG. 11. In this case, a time taken for the control logic circuit 160 to keep the locking enable signal LKEN in an enabled state can be determined in accordance with the logic level of the phase detection signal PDOUT output from the phase detector 121. To detail this, the phase detector 121 disables the phase detection signal PDOUT when a phase difference between the input clock signal ECLK' and the reference clock signal FBCLK is within a predetermined range. In addition, the phase detector 121 enables the phase detection signal PDOUT when the phase difference is out of the range, and keeps the enabled state of the phase detection signal PDOUT until the phase difference is in the range. While the phase detection signal PDOUT is kept in the enabled state, the enable control unit 130 outputs the enable control signal ENCTL in an enabled state in synchronization with the global clock signal GCLK2. Consequently, the control logic circuit 160 keeps the enabled state of the locking enable signal LKEN while the enable control signal ENCTL is enabled even when the shift output signal SHFT is periodically enabled and then disabled. Accordingly, the DLL 100, in response to the locking enable signal LKEN, carries out the locking operation until the enable control signal ENCTL is disabled (that is, until the phase difference between the input clock signal ECLK' and the reference clock signal FBCLK is within the predetermined range).

The DLL 100 is enabled to carry out the locking operation whenever the locking enable signal LKEN is enabled in the power down mode. When the phase detection signal PDOUT is in a logical high state during the periodical locking operation of the DLL 100 (that is, when the phase difference between the input clock signal ECLK' and the reference clock signal FBCLK is out of the predetermined range), the power down control unit 103 enables the DLL 100 until the phase difference is within the predetermined range. In addition, when the phase detection signal PDOUT is in a logical low state during the periodical locking operation of the DLL 100 (that is, when the phase difference between the input clock signal ECLK' and the reference clock signal FBCLK is within the predetermined range), the power down control unit 103 enables the DLL 100 only while the shift output signal SHFT is enabled.

Figure 12:
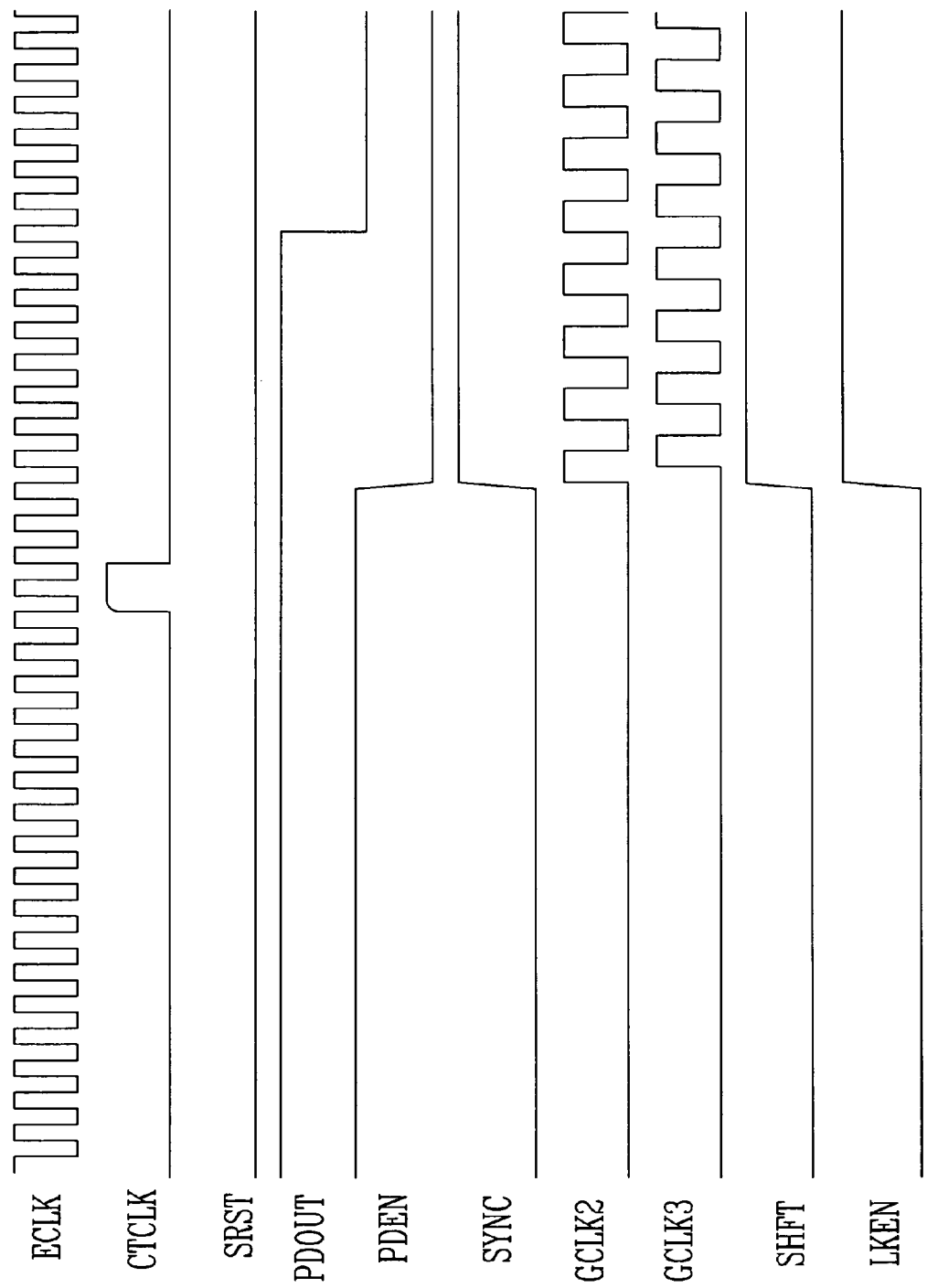

Referring to the 'D' portion of FIG. 8 and FIG. 12, when the DLL 100 exits the power down mode, that is, when the power down signal PDEN is disabled, the power down synchronization unit 140 outputs the synchronization signal SYNC in a logical high state. As a result, the control logic circuit 160 enables the locking enable signal LKEN in response to the synchronization signal SYNC. In response to the locking enable signal LKEN, the AND gate 111 receives the input clock signal ECLK, and outputs the input clock signal ECLK' to the global clock generator 102, the phase detector 121 and the coarse delay unit 123 of the clock delay unit 104. The clock delay unit 104, upon receipt of the input clock signal ECLK', carries out the locking operation based on the input clock signal ECLK', and outputs the delay clock signal MCLK. The output buffer 105 outputs an internal clock signal OCLK in response to the delay clock signal MCLK.

As described above, the power down control unit 103 periodically enables the DLL 100 in the power down mode, so that the DLL 100 can periodically carry out the locking operation to be suitable for the external clock signal EXCLK which can be changed in the power down mode, thereby updating the locking information. As a result, the phenomenon that the phase difference between the external clock signal EXCLK and the internal clock signal OCLK extremely increases when the DLL 100 exits the power down mode can be prevented, so that the locking operation time of the DLL 100 can be reduced.

Figure 13:
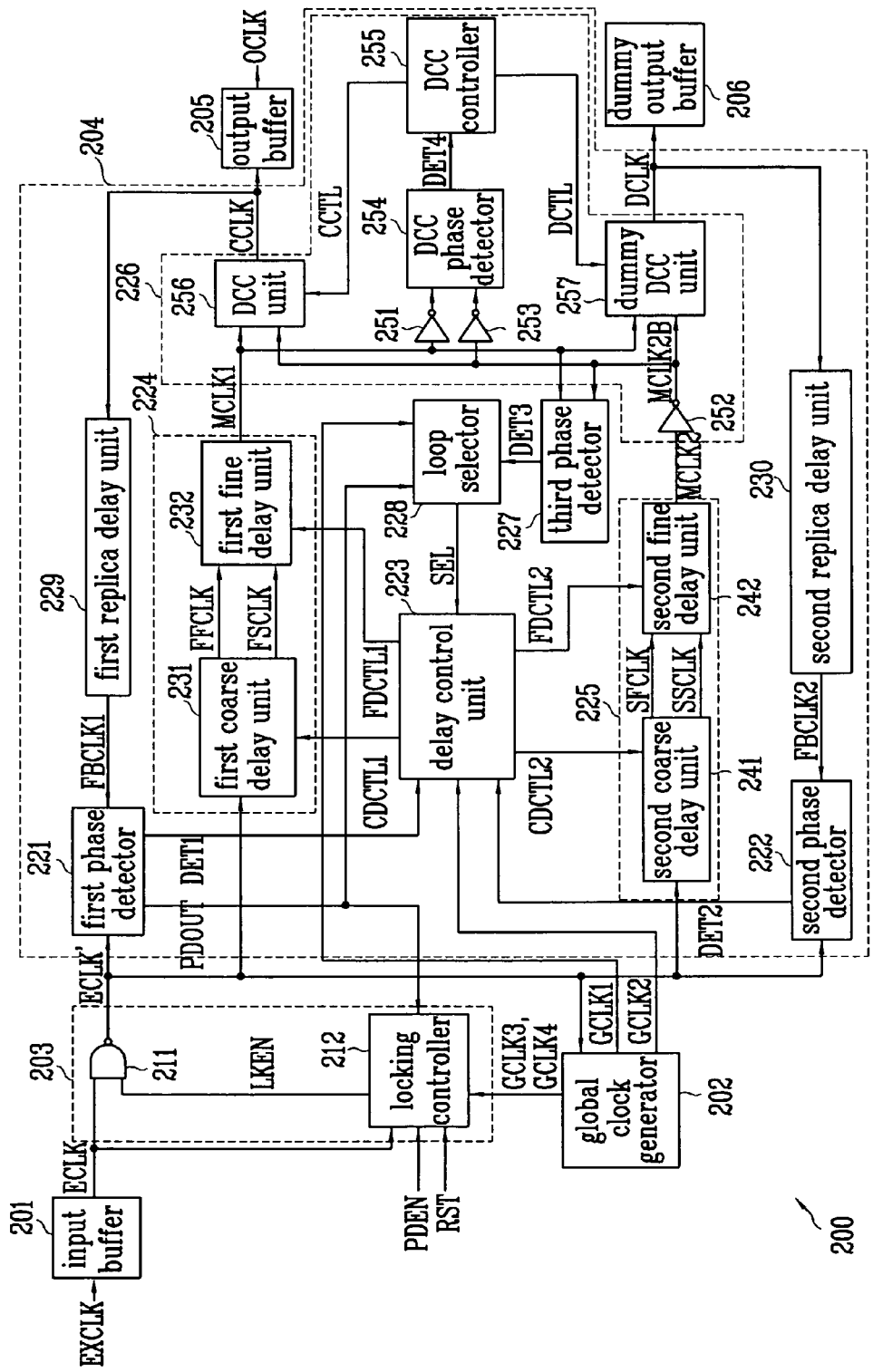
FIG. 13 is a diagram schematically illustrating a DLL in accordance with another embodiment of the present invention.
Figure 14:
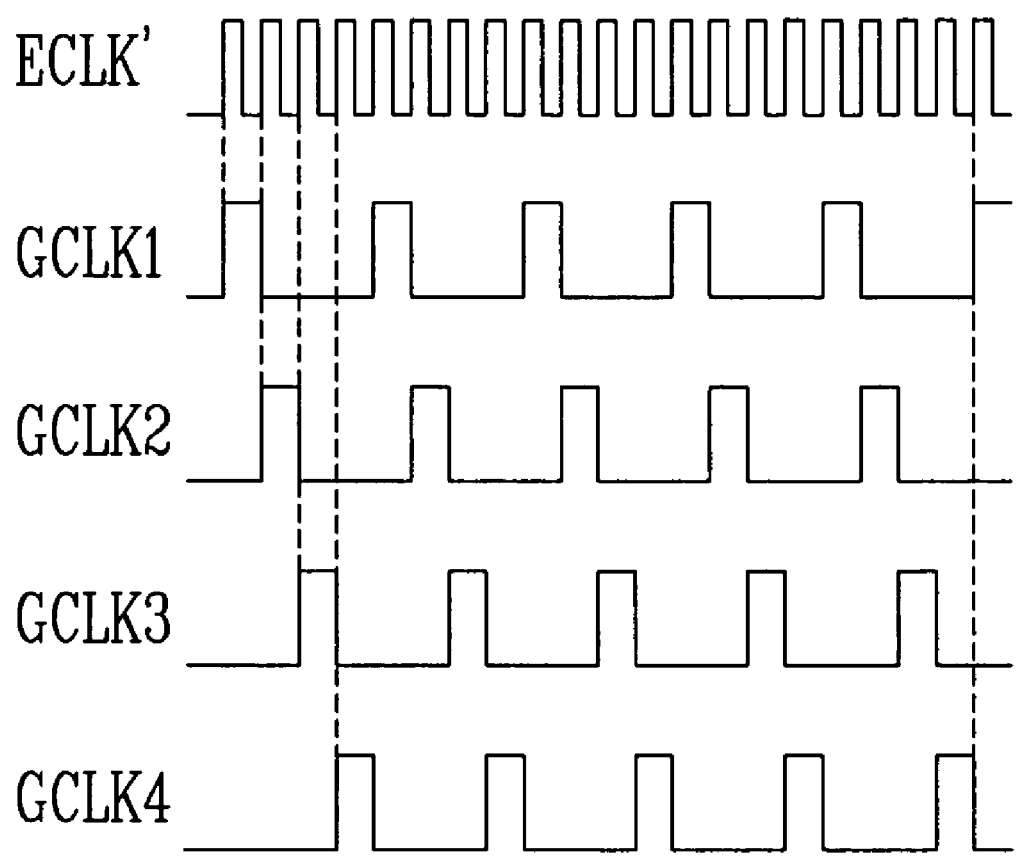
FIG. 14 is a timing diagram of signals associated with an operation of the global clock generator illustrated in FIG. 13.

FIG. 13 is a block diagram schematically illustrating the DLL in accordance with another embodiment of the present invention. The DLL 200 includes an input buffer 201, a global clock generator 202, a power down control unit 203, a clock delay unit 204, an output buffer 205, and a dummy output buffer 206. A configuration and a detailed operation of the DLL 200 are similar to those of the DLL 100 described with reference to FIG. 1, so that a description will be focused on the difference between the DLLs 100 and 200 for simplicity. The global clock generator 202 first generates global clock signals GCLK1 to GLCK4 having different phases from each other as illustrated in FIG. 14 based on an input clock signal ECLK'. Alternatively, the global clock generator 202 may generate the global clock signals GCLK1 and GCLK2 only. In this case, the locking controller 212 of the power down control unit 203 and the global delay unit 204 operate in synchronization with the global clock signals GCLK1 and GCLK2. The AND gate 211 of the power down control unit 203, in response to the locking enable signal LKEN, outputs an input clock signal ECLK' to both of the global clock generator 202 and the clock delay unit 204, or stops the output operation of the input clock signal.

The clock delay unit 204 includes a first phase detector 221, a second phase detector 222, a delay control unit 223, a first delay line 224, a second delay line 225, a duty ratio correction unit 226, a third phase detector 227, a loop selector 228, a first replica delay unit 229, and a second replica delay unit 230. The first phase detector 221 detects a phase difference between the input clock signal ECLK' and a reference clock signal FBCLK1, and outputs a phase detection signal PDOUT and a detection signal DET1 in accordance with the detection. Preferably, the first phase detector 221 disables the phase detection signal PDOUT when the phase difference is within a predetermined range, and enables the phase detection signal PDOUT when the phase difference is out of the range. In addition, when the input clock signal ECLK' is not received, the first phase detector 221 enables the phase detection signal PDOUT.

The second phase detector 222 detects a phase difference between the input clock signal ECLK' and the reference clock signal FBCLK2, and outputs the detection signal DET2 in accordance with the detection. The delay control unit 223 selects one of the first and second delay lines 224 and 225 in response to a loop selection signal SEL. In addition, the delay control unit 223 generates coarse delay control signals CDCTL1 and CDCTL2 and fine delay control signals FDCTL1 and FDCTL2 in response to one of the detection signals DET1 and DET2. The delay control unit 223, in synchronization with the global clock signal GCLK2, outputs the coarse delay control signals CDCTL1 and CDCTL2 and the fine delay control signals FDCTL1 and FDCTL2 to the first and second delay lines 224 and 225, respectively.

The first delay line 224 delays the input clock signal ECLK' by a first predetermined time, and outputs a delay clock signal MCLK1. The first delay line 224 includes a first coarse delay unit 231 and a first fine delay unit 232. Configurations and operations of the first coarse delay unit 231 and the first fine delay unit 232 are similar to those of the coarse delay unit 123 and the fine delay unit 124, so that the description thereof will be omitted for simplicity. The second delay line 225 delays the input clock signal ECLK' by a second predetermined time, and outputs a delay clock signal MCLK2. The second delay line 225 includes a second coarse delay unit 241 and a second fine delay unit 242. Configurations and operations of the second coarse delay unit 241 and the second fine delay unit 242 are similar to those of the coarse delay unit 123 and the fine delay unit 124, so that the description thereof will be omitted for simplicity.

The duty ratio correction unit 226 includes inverters 251 to 253, a duty cycle correction (DCC) phase detector 254, a DCC controller 255, a DCC unit 256, and a dummy DCC unit 257. The inverter 251 inverts the delay clock signal MCLK1 received from the first fine delay unit 232, and outputs the inverted delay clock signal MCLK1B to the DCC phase detector 254. The inverter 252 inverts the delay clock signal MCLK2 received from the second fine delay unit 242, and outputs the inverted delay clock signal MCLK2B to the dummy DCC unit 257. The inverter 253 inverts the inverted delay clock signal MCLK2B again, and outputs the delay clock signal MCLK2 to the DCC phase detector 254. The DCC phase detector 254 detects a phase difference between the inverted delay clock signal MCLK1B and the delay clock signal MCLK2, and outputs a detection signal DET4 in accordance with the detection. The DCC controller 255 outputs correction control signals CCTL and DCTL in response to the detection signal DET4. The DCC unit 256 receives the delay clock signal MCLK1 and the inverted delay clock signal MCLK2B, corrects the duty ratio of the delay clock signal MCLK1 in response to the correction control signal CCTL, and outputs the corrected signal as a correction clock signal CCLK. In addition, the dummy DCC unit 257 receives the delay clock signal MCLK1 and the inverted delay clock signal MCLK2B, corrects the duty ratio of the inverted delay clock signal MCLK2B in response to the correction control signal DCTL, and outputs the corrected signal as a dummy correction clock signal DCLK. In this case, the detailed operation of the duty ratio correction unit 226 can be well understood by those skilled in the art, so that the description thereof will be omitted.

The third phase detector 227 detects a phase difference between the delay clock signal MCLK1 and the inverted delay clock signal MCLK2B, and outputs a detection signal DET3 in accordance with the detection. The loop selector 228 generates the loop selection signal SEL in response to the phase detection signal PDOUT and the detection signal DET3, and outputs the loop selection signal SET to the delay control unit 223 in synchronization with the global clock signal GCLK1.

The first replica delay unit 229 delays the correction clock signal CCLK by a third predetermined time, and outputs the delayed signal as the reference clock signal FBCLK1. The second replica delay unit 230 delays the dummy correction clock signal DCLK by a fourth predetermined time, and outputs the delayed signal as the reference clock signal FBCLK2.

The output buffer 205 outputs an internal clock signal OCLK in response to the correction clock signal CCLK. The dummy output buffer 206 receives the dummy correction clock signal DCLK. Preferably, the dummy output buffer 206 may be designed to have impedance corresponding to the output buffer 205.

The power down control unit 203, similar to the power down control unit 103, also periodically enables the DLL 200 in the power down mode. Consequently, the DLL 200 periodically carries out the locking operation in the power down mode, so that the locking information of the DLL 200 can be updated to be suitable for the external clock signal EXCLK that can be changed. As a result, the phenomenon that the phase difference between the external clock signal EXCLK and the internal clock signal OCLK extremely increases when the DLL 200 exits the power down mode can be prevented, so that the locking operation time of the DLL 200 can be reduced.

As described above, a DLL and a locking operation method of the same according to the present invention have the DLL periodically enabled in a power down mode to carry out the locking operation to reduce a phase difference between an external clock signal and an internal clock signal, so that a consumed power in the power down mode can be decreased, and the DLL can operate at a fast speed after the power down mode.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A Delay Locked Loop (DLL) comprising:
a global clock generator generating a plurality of global clock signals based on an input clock signal;
a clock delay unit operating in synchronization with one of the global clock signals, comparing a phase of a reference clock signal generated based on the input clock signal with a phase of the input clock signal, and outputting a phase detection signal in accordance with the comparison and a delay clock signal by delaying the input clock signal for a predetermined time; and
a power down control unit outputting the input clock signal to both of the global clock generator and the clock delay unit in response to at least one of the plurality of global clock signals, the phase detection signal, and a power down signal.

2. The DLL as set forth in claim 1, further comprising:
an input buffer receiving an external clock signal and outputting the external clock signal to the power down control unit as the input clock signal; and
an output buffer outputting an internal clock signal in response to the delay clock signal.

3. The DLL as set forth in claim 1, wherein the global clock signals include first to N global clock signals having different phases from each other, where N is an integer greater than one.

4. The DLL as set forth in claim 3, wherein the global clock generator generates the first to N global clock signals in the form of pulse signals which are periodically toggled based on the input clock signal.

5. The DLL as set forth in claim 4, wherein a pulse width of each of the first to N global clock signals corresponds to a predetermined number of cycles of the input clock signal.

6. The DLL as set forth in claim 4, wherein a pulse width of each of the first to N global clock signals corresponds to one cycle of the input clock signal.

7. The DLL as set forth in claim 3, wherein the power down control unit comprises:
a locking controller outputting a locking enable signal in response to the (N−1)th and Nth global clock signals, the power down signal, and the phase detection signal; and
an output logic circuit receiving the input clock signal, outputting the input clock signal to both of the global clock generator and the clock delay unit or stopping an output operation of the input clock signal in response to the locking enable signal.

8. The DLL as set forth in claim 7, wherein the output logic circuit includes an AND gate having input terminals where the locking enable signal and the input clock signal are input, and an output terminal connected to the global clock generator and the clock delay unit.

9. The DLL as set forth in claim 7, wherein the locking controller comprises:
an enable control unit generating an enable control signal in response to the phase detection signal and the (N−1)th global clock signal;
a power down synchronization unit generating a synchronization signal in response to the power down signal and the (N−1)th global clock signal;
a locking period determination unit being reset in response to the Nth global clock signal and a shift output signal, or an external reset signal, dividing the input clock signal by a predetermined division rate to generate a control clock signal, and generating the shift output signal based on the control clock signal; and
a control logic circuit outputting the locking enable signal in response to the enable control signal, the synchronization signal, and the shift output signal.

10. The DLL as set forth in claim 9, wherein the clock delay unit outputs the phase detection signal at a first logic level when a phase difference between the reference clock signal and the input clock signal is included within a predetermined range, and outputs the phase detection signal at a second logic level when the phase difference is out of the range, and when the (N−1)th global clock signal is toggled, the enable control unit outputs the enable control signal at the first logic level when it receives the phase detection signal at the first logic level, and outputs the enable control signal at the second logic level when it receives the phase detection signal at the second logic level.

11. The DLL as set forth in claim 10, wherein the power down synchronization unit, outputs the synchronization signal at the first logic level in response to the power down signal when the (N−1)th global clock signal is toggled in the power down mode, and while the synchronization signal is at the first logic level, the control logic circuit enables the locking enable signal regardless of the logic level of the shift output signal when it receives the enable control signal at the second logic level, and enables or disables the locking enable signal in accordance with the logic level of the shift output signal when it receives the enable control signal at the first logic level, and the output logic circuit outputs the input clock signal to each of the global clock generator and the clock delay unit when the locking enable signal is enabled.

12. The DLL as set forth in claim 9, wherein the enable control unit includes a D flip-flop outputting the enable control signal based on the phase detection signal when the (N−1)th global clock signal is toggled.

13. The DLL as set forth in claim 9, wherein the power down signal is enabled in the power down mode and is disabled in an active mode, and when the (N−1)th global clock signal is toggled, the power down synchronization unit disables the synchronization signal when the power down signal is enabled, and enables the synchronization signal when the power down signal is disabled, the control logic circuit enables the locking enable signal regardless of the logic levels of the enable control signal and the shift output signal when the synchronization signal is enabled, and the output logic circuit outputs the input clock signal to each of the global clock generator and the clock delay unit when the locking enable signal is enabled.

14. The DLL as set forth in claim 9, wherein the power down synchronization unit includes:

a D flip-flop receiving the power down signal and outputting it as an internal synchronization signal when the (N−1)th global clock signal is toggled; and a NAND gate outputting the synchronization signal in response to the power down signal and the internal synchronization signal.

15. The DLL as set forth in claim 14, wherein the power down synchronization unit includes an inverter inverting the power down signal and outputting the inverted power down signal, and the D flip-flop is reset in response to the inverted power down signal.

16. The DLL as set forth in claim 9, wherein the locking period determination unit includes:

a divider dividing the input clock signal by a predetermined division rate to generate a control clock signal;

a reset control logic circuit outputting a reset control signal in response to the Nth global clock signal, the shift output signal, or the external reset signal; and a shift register unit being reset in response to the reset control signal, and outputting the shift output signal in response to the control clock signal.

17. The DLL as set forth in claim 16, wherein the divider outputs the control clock signal in the form of pulse signal which is toggled one time per predetermined number of cycles of the input clock signal based on the frequency division rate, and is reset in response to the external reset signal.

18. The DLL as set forth in claim 16, wherein the divider includes:

a division signal generator being reset in response to the external reset signal, dividing the input clock signal by a predetermined division rate, and outputting a division output signal; and a control clock output circuit outputting the control clock signal based on the division output signal.

19. The DLL as set forth in claim 18, wherein the division signal generator includes first to third division circuits each being reset in response to the external reset signal, the first division circuit outputs a first division signal in response to the input clock signal, the second division circuits are connected in series between the first division circuit and the third division circuit, and each of the second division circuits outputs a second division signal in response to an output signal of the preceding first or second division circuit which is connected to an input terminal of the following second division circuit, the third division circuit outputs the division output signal in response to the second division signal received from the last one of the second division circuits, and the determined division rate is changed when the number of the second division circuits included in the division signal generator is changed.

20. The DLL as set forth in claim 19, wherein the first division circuit includes:

an inverter inverting the first division signal and outputting the inverted first division signal; and a D flip-flop receiving the inverted first division signal and outputting it as the first division signal when the input clock signal is toggled.

21. The DLL as set forth in claim 19, wherein each of the second division circuits includes:

an inverter inverting the second division signal, and outputting the inverted second division signal; and a D flip-flop receiving the inverted second division signal and outputting it as the second division signal when the output signal of the preceding first or second division circuit is toggled.

22. The DLL as set forth in claim 19, wherein the third division circuit includes:

an inverter inverting the division output signal and outputting the inverted division output signal; and a D flip-flop receiving the inverted division output signal and outputting it as the division output signal when the second division signal received from the last one of the second division circuits is toggled.

23. The DLL as set forth in claim 18, wherein the control clock output circuit includes:

a delay logic circuit delaying the division output signal and outputting the delay signal; and a clock output circuit outputting the control clock signal in response to the division output signal and the delay signal.

24. The DLL as set forth in claim 23, wherein the delay logic circuit includes a plurality of inverters which are connected in series.

25. The DLL as set forth in claim 23, wherein the delay logic circuit inverts the division output signal and then delays the division output signal, and the clock output circuit outputs the control clock signal in response to the division output signal and the delay signal.

26. The DLL as set forth in claim 16, wherein when the Nth global clock signal is toggled, the reset control logic circuit enables the reset control signal when the shift output signal is enabled or when the external reset signal is enabled, and the shift register unit is reset when the reset control signal is enabled.

27. The DLL as set forth in claim 16, wherein the reset control logic circuit includes:

an inverter inverting the external reset signal and outputting the inverted external reset signal;

a first NAND gate outputting a logic signal in response to the Nth global clock signal and the shift output signal; and a second NAND gate outputting the reset control signal in response to the logic signal and the inverted external reset signal.

28. The DLL as set forth in claim 26, wherein when the control clock signal is toggled after the shift register unit is reset, the shift register unit enables the shift output signal after the predetermined number of cycles of the control clock signal, and disables the shift output signal when the reset control signal is enabled.

29. The DLL as set forth in claim 16, wherein the shift register unit enables the shift output signal when a predetermined time passes from a point of time that the control clock signal is toggled for the first time after the shift register unit is reset, the shift register unit includes first to third shift registers each of which is reset in response to the reset control signal, the first shift register outputs a first shift signal in response to an internal voltage when the control clock signal is toggled, the second shift registers are connected in series between the first shift register and the third shift register, each of the second shift registers outputs a second shift signal in response to the first shift signal or the second shift signal received from the preceding first or second shift register which is connected to an input terminal of the following second shift register when the control clock signal is toggled, the third shift register outputs the shift output signal in response to the second shift signal received from the last one of the second shift registers when the control clock signal is toggled, and the predetermined time is changed when the number of the second shift registers included in the shift register unit is changed.

30. The DLL as set forth in claim 29, wherein the first shift register includes a first D flip-flop outputting the first shift signal of the internal voltage level when the control clock signal is toggled, each of the second shift registers includes a second D flip-flop receiving a signal input to its input terminal and outputting the signal as one of the second shift signals, and the third shift register includes a third D flip-flop receiving one of the second shift signals received from the last one of the second D flip-flops and outputting the one as a third shift signal.

31. The DLL as set forth in claim 29, wherein the locking controller enables the locking enable signal one time per the predetermined time in the power down mode, and the output logic circuit outputs the input clock signal to both of the global clock generator and the clock delay unit whenever the locking enable signal is enabled.

32. The DLL as set forth in claim 9, wherein the control logic circuit includes:
 a NOR gate outputting a logic signal in response to the enable control signal and the synchronization signal;
 an inverter inverting the shift output signal, and outputting the inverted shift output signal; and
 a NAND gate outputting the locking enable signal in response to the logic signal and the inverted shift output signal.

33. The DLL as set forth in claim 1, wherein the clock delay unit includes:
 a phase detector detecting a phase difference between the input clock signal and the reference clock signal, and outputting the phase detection signal and a detection signal in accordance with the detection;
 a coarse delay unit adjusting a coarse delay time in response to a coarse delay control signal, delaying the input clock signal by the adjusted coarse delay time, and outputting first and second coarse delay clock signals;
 a fine delay unit mixing the first and second coarse delay clock signals in response to a fine delay control signal, selecting one of the mixed signals having different phases from each other and present between the first and second coarse delay clock signals, and outputting the selected signal as the delay clock signal;
 a delay control unit generating the coarse delay control signal and the fine delay control signal in response to the detection signal, and outputting the coarse delay control signal and the fine delay control signal to the respective coarse delay unit and the fine delay unit in synchronization with one of the global clock signals; and
 a replica delay unit delaying the delay clock signal by a predetermined time, and outputting the delayed signal as the reference clock signal.

34. The DLL as set forth in claim 1, wherein the power down signal is enabled in the power down mode and is disabled in an active mode, and the power down control unit outputs the input clock signal to both of the global clock generator and the clock delay unit for a second predetermined time once per first predetermined time while the power down signal is kept in an enabled state, and stops an output operation of the input clock signal during the rest time except the time that the output operation of the input clock signal is carried out among the total period that the power down signal is kept in an enabled state.

35. A Delay Locked Loop (DLL), comprising:
 a global clock generator generating a plurality of global clock signals based on an input clock signal;
 a phase detector detecting a phase difference between the input clock signal and the reference clock signal, and outputting a phase detection signal and a detection signal in accordance with the detection;
 a coarse delay unit adjusting a coarse delay time in response to a coarse delay control signal, delaying the input clock signal by the adjusted coarse delay time, and outputting first and second coarse delay clock signals;
 a fine delay unit mixing the first and second coarse delay clock signals in response to a fine delay control signal, selecting one of the mixed signals having different phases from each other and present between the first and second coarse delay clock signal, and outputting the selected signal as a delay clock signal;
 a delay control unit generating the coarse delay control signal and the fine delay control signal in response to the phase detection signal, and outputting the coarse delay control signal and the fine delay control signal to the coarse delay unit and the fine delay unit in synchronization with one of the global clock signals, respectively;
 a replica delay unit delaying the delay clock signal by a predetermined time, and outputting the delayed signal as the reference clock signal; and
 a power down control unit outputting the input clock signal to the global clock generator, the phase detector, and the coarse delay unit in response to at least one of the plurality of global clock signals, the phase detection signal, and a power down signal, respectively.

36. The DLL as set forth in claim 35, further comprising:
 an input buffer receiving an external clock signal and outputting the external clock signal to the power down control unit as the input clock signal; and
 an output buffer outputting an internal clock signal in response to the delay clock signal.

37. The DLL as set forth in claim 35, wherein the global clock signals include first to N global clock signals having different phases from each other, where N is an integer greater than one.

38. The DLL as set forth in claim 37, wherein the global clock generator generates the first to N global clock signals in the form of pulse signals which are periodically toggled based on the input clock signal.

39. The DLL as set forth in claim 38, wherein a pulse width of each of the first to N global clock signals corresponds to one cycle of the input clock signal.

40. The DLL as set forth in claim 37, wherein the power down control unit comprises:
 a locking controller outputting a locking enable signal based on the (N−1)th and Nth global clock signals, the power down signal, and the phase detection signal; and
 an output logic circuit receiving the input clock signal, outputting the input clock signal to both of the global clock generator and the clock delay unit or stopping an output operation of the input clock signal in response to the locking enable signal.

41. The DLL as set forth in claim 40, wherein the output logic circuit includes an AND gate having input terminals where the locking enable signal and the input clock signal are input, and an output terminal connected to the global clock generator, the phase detector, and the clock delay unit.

42. The DLL as set forth in claim 40, wherein the locking controller includes:
 an enable control unit generating an enable control signal in response to the phase detection signal and the (N−1)th global clock signal;

a power down synchronization unit generating a synchronization signal in response to the power down signal and the (N−1)th global clock signal;

a locking period determination unit being reset in response to the Nth global clock signal and a shift output signal, or an external reset signal, dividing the input clock signal by a predetermined division rate to generate a control clock signal, and generating the shift output signal based on the control clock signal; and a control logic circuit outputting the locking enable signal in response to the enable control signal, the synchronization signal, and the shift output signal.

43. The DLL as set forth in claim 35, wherein the power down signal is enabled in the power down mode and is disabled in an active mode, and the power down control unit outputs the input clock signal to the global clock generator, the phase detector, and the coarse delay unit once per first predetermined time while the power down signal is kept in an enabled state, and stops an output operation of the input clock signal during the rest time except the time that the output operation of the input clock signal is carried out among the total period that the power down signal is kept in an enabled state.

44. A Delay Locked Loop (DLL), comprising:

a global clock generator generating first to N global clock signals based on an input clock signal, where N is an integer greater than one;

a clock delay unit operating in synchronization with at least one of the first to N global clock signals, comparing a phase of each of first and second reference clock signals generated based on the input clock signal with a phase of the input clock signal, outputting a phase detection signal in accordance with the comparison, delaying the input clock signal by a predetermined time, and correcting a duty ratio of the delay clock signal to output a correction clock signal; and a power down control unit outputting the input clock signal to both of the global clock generator and the clock delay unit in response to at least one of the plurality of global clock signals, the phase detection signal, and a power down signal.

45. The DLL as set forth in claim 44, further comprising:

an input buffer receiving an external clock signal and outputting it to the power down control unit as the input clock signal; and an output buffer outputting an internal clock signal in response to the correction clock signal.

46. The DLL as set forth in claim 44, wherein phases of the first to N global clock signals are different from each other, and the global clock generator generates the first to N global clock signals in the form of pulse signals which are periodically toggled based on the input clock signal.

47. The DLL as set forth in claim 46, wherein a pulse width of each of the first to N global clock signals corresponds to one cycle of the input clock signal.

48. The DLL as set forth in claim 44, wherein the power down control unit includes:

a locking controller outputting a locking enable signal in response to the (N−1)th and Nth global clock signals, the power down signal, and the phase detection signal; and an output logic circuit receiving the input clock signal, outputting the input clock signal to both of the global clock generator and the clock delay unit or stopping an output operation of the input clock signal in response to the locking enable signal.

49. The DLL as set forth in claim 48, wherein the locking controller includes:

an enable control unit generating an enable control signal in response to the phase detection signal and the (N−1)th global clock signal;

a power down synchronization unit generating a synchronization signal in response to the power down signal and the (N−1)th global clock signal;

a locking period determination unit being reset in response to the Nth global clock signal and a shift output signal, or an external reset signal, dividing the input clock signal by a predetermined division rate to generate a control clock signal, and generating the shift output signal based on the control clock signal; and a control logic circuit outputting the locking enable signal in response to the enable control signal, the synchronization signal, and the shift output signal.

50. The DLL as set forth in claim 44, wherein the clock delay unit includes:

a first phase detector detecting a phase difference between the input clock signal and the first reference clock signal, and outputting the phase detection signal and a first detection signal in accordance with the detection;

a second phase detector detecting a phase difference between the input clock signal and the second reference clock signal, and outputting a second detection signal in accordance with the detection;

a first delay line delaying the input clock signal by a first predetermined time, and outputting a first delay clock signal;

a second delay line delaying the input clock signal by a second predetermined time, and outputting a second delay clock signal;

a delay control unit operating in synchronization with any one of the first to Nth global clock signals, selecting any one of the first and second delay lines in response to a loop selection signal, and controlling an operation of the selected first or second delay line in response to the first or second detection signal; and a duty ratio correction unit correcting a duty ratio of the first delay clock signal in accordance with a phase difference between the first and second delay clock signals, and outputting the correction clock signal, wherein the delay clock signal is the first delay clock signal, and the predetermined time is the first predetermined time.

51. The DLL as set forth in claim 50, wherein the duty ratio correction unit further outputs a dummy correction clock signal, and the clock delay unit includes:

a third phase detector detecting a phase difference between an inverted signal of the second delay clock signal and the first delay clock signal, and outputting a third detection signal;

a loop selector generating the loop selection signal in response to the third detection signal, and outputting the loop selection signal to the delay control unit in synchronization with another one of the first to Nth global clock signals;

a first replica delay unit delaying the correction clock signal by a third predetermined time, and outputting the delayed signal as the first reference clock signal; and a second replica delay unit delaying the dummy correction clock signal by a fourth predetermined time, and outputting the delayed signal as the second reference clock signal.

52. The DLL as set forth in claim 51, further comprising:

an output buffer outputting an internal clock signal in response to the correction clock signal; and a dummy output buffer having an impedance corresponding to the output buffer, and receiving the dummy correction clock signal.

53. The DLL as set forth in claim 50, wherein the duty ratio correction unit includes:
- a first inverter inverting the first delay clock signal, and outputting the inverted first delay clock signal;
- a second inverter inverting the second delay clock signal, and outputting the inverted second delay clock signal;
- a duty cycle correction (DCC) phase detector detecting a phase difference between the inverted first and second delay clock signals, and outputting a fourth detection signal;
- a DCC controller outputting first and second correction control signals in response to the fourth detection signal;
- a DCC unit receiving the first delay clock signal and the inverted second delay clock signal, correcting a duty ratio of the first delay clock signal in response to the first correction control signal, and outputting the corrected signal as the correction clock signal; and
- a dummy DCC unit receiving the first delay clock signal and the inverted second delay clock signal, correcting a duty ratio of the inverted second delay clock signal in response to the second correction control signal, and outputting the corrected signal as the dummy correction clock signal.

54. The DLL as set forth in claim 50, wherein when the delay control unit selects the first delay line, the delay control unit generates a coarse delay control signal and a fine delay control signal which are changed in accordance with the first detection signal, and outputs the coarse delay control signal and the fine delay control signal to the first delay line in synchronization with any one of the first to Nth global clock signals,
wherein the first delay line includes:
- a coarse delay unit adjusting a coarse delay time in response to the coarse delay control signal, delaying the input clock signal by the adjusted coarse delay time, and outputting first and second coarse delay clock signals; and
- a fine delay unit mixing the first and second coarse delay clock signals in response to the fine delay control signal, selecting any one of the mixed signals having different phases from each other and present between the first and second coarse delay clock signals, and outputting the selected signal as the first delay clock signal,
wherein the first predetermined time is determined by the coarse delay time, and a time taken until the fine delay unit outputs the first delay clock signal.

55. The DLL as set forth in claim 50, wherein when the delay control unit selects the second delay line, the delay control unit generates a coarse delay control signal and a fine delay control signal which are changed in accordance with the second detection signal, and outputs the coarse delay control signal and the fine delay control signal to the second delay line in synchronization with any one of the first to Nth global clock signals,
wherein the second delay line includes:
- a coarse delay unit adjusting a coarse delay time in response to the coarse delay control signal, delaying the input clock signal by the adjusted coarse delay time, and outputting first and second coarse delay clock signals; and
- a fine delay unit mixing the first and second coarse delay clock signals in response to the fine delay control signal, selecting any one of the mixed signals having different phases from each other and present between the first and second coarse delay clock signals, and outputting the selected signal as the second delay clock signal,
wherein the second predetermined time is determined by the coarse delay time, and a time taken until the fine delay unit outputs the second delay clock signal.

56. The DLL as set forth in claim 44, wherein the power down signal is enabled in the power down mode and is disabled in an active mode, and the power down control unit outputs the input clock signal to both of the global clock generator and the clock delay unit for a second predetermined time once per first predetermined time while the power down signal is kept in an enabled state, and stops an output operation of the input clock signal during the rest time except the time that the output operation of the input clock signal is carried out among the total period that the power down signal is kept in an enabled state.

57. A locking operation method of a Delay Locked Loop (DLL), comprising:
- outputting a locking enable signal with a first logic level while in an active mode, with the first logic level for a predetermined time once per predetermined number of cycles of an input clock signal in a power down mode
- outputting a locking enable signal with a second logic level during the rest period except during the period of the first logic level in the total period of the power down mode;
- outputting the input clock signal to a clock delay unit so as to have the clock delay unit detect a phase difference between the input clock signal and a reference clock signal when the locking enable signal has the first logic level, generate a phase detection signal in accordance with the detection, and selectively carry out a locking operation; and
- stopping an operation of outputting the input clock signal to the clock delay unit so as to have the clock delay unit stop the locking operation when the locking enable signal has the second logic level.

58. The method as set forth in claim 57, further comprising:
- receiving an external clock signal, and outputting the input clock signal; and
- generating a plurality of global clock signals based on the input clock signal when the locking enable signal has the first logic level.

59. The method as set forth in claim 58, wherein the global clock signals have first to N global clock signals having different phases from each other, and outputting the locking enable signal includes, where N is an integer greater than one:
- generating an enable control signal in response to the phase detection signal and the (N−1)th global clock signal;
- generating a synchronization signal in response to a power down signal enabled in the power down mode and the (N−1)th global clock signal;
- dividing the input clock signal by a predetermined division rate to generate a control clock signal;
- generating the shift output signal in response to the control clock signal; and
- outputting the locking enable signal in response to the enable control signal, the synchronization signal, and the shift output signal.

60. The method as set forth in claim 59, further comprising:
- outputting the reset control signal in response to the Nth global clock signal and the shift output signal, or in response to an external reset signal; and
- initializing a logic value of the shift output signal in response to the reset control signal.

* * * * *